United States Patent [19]

Sabersky et al.

[11] Patent Number: 4,827,436

[45] Date of Patent: May 2, 1989

[54] NON-CONTACT HIGH RESOLUTION DISPLACEMENT MEASUREMENT TECHNIQUE

[75] Inventors: Andrew P. Sabersky; Nicholas Littlestone; Jack E. Abbott, all of Santa Cruz; William J. Gibbons, Modesto; Robert R. D'Orazio, all of Santa Cruz, Calif.; Nathan R. Smith, Stillwater, Minn.

[73] Assignee: Micro Component Technology, Inc., Shoreview, Minn.

[21] Appl. No.: 41,873

[22] Filed: Apr. 22, 1987

[51] Int. Cl.⁴ .................................... G01R 31/02
[52] U.S. Cl. ................................ 364/559; 364/552; 356/372; 356/374; 250/561
[58] Field of Search .............. 364/550, 552, 559, 490; 356/372, 375, 385–387, 400, 374; 250/560–561, 563, 236

[56] References Cited

U.S. PATENT DOCUMENTS

| | | | |
|---|---|---|---|
| 2,185,010 | 12/1939 | Young | 356/69 |
| 3,272,021 | 9/1966 | Weber | 278/64 |
| 3,768,911 | 10/1973 | Erickson | 356/374 |
| 3,779,647 | 12/1973 | Dawson | 356/374 |
| 3,856,412 | 12/1974 | Zanoni | 356/167 |
| 3,901,606 | 8/1975 | Watanabe et al. | 356/372 |
| 4,215,939 | 8/1980 | Miller et al. | 356/371 |
| 4,264,202 | 4/1981 | Gugliotta et al. | 250/561 |
| 4,273,448 | 6/1981 | Schiler | 356/374 |
| 4,549,808 | 10/1985 | Ernst | 356/374 |
| 4,553,843 | 11/1985 | Langley et al. | 356/375 |
| 4,582,430 | 4/1986 | Price | 356/372 |
| 4,601,581 | 7/1986 | Covey et al. | 356/375 |
| 4,704,700 | 11/1987 | Linker et al. | 364/550 |
| 4,722,605 | 2/1988 | Livnat et al. | 356/374 |
| 4,770,533 | 9/1988 | Suwa | 356/375 |
| 4,777,360 | 10/1988 | Carner | 356/375 |

Primary Examiner—Parshotam S. Lall
Assistant Examiner—Ellis B. Ramirez
Attorney, Agent, or Firm—Fliesler, Dubb, Meyer & Lovejoy

[57] ABSTRACT

Apparatus is disclosed for optically detecting the position of an edge of a workpiece (such as an IC lead tip) in a sensing plane, involving the emission of electromagnetic energy from a known source region in the sensing plane such as to cause the edge to create a shadow having a penumbra in the sensing plane. Two detectors determine the amount of energy which reach two known detection regions in the sensing plane and wholly within the penumbra. The amount of energy detected by one detector determines a first curve in the sensing plane on which the edge must lie, and the amount of energy detected by the other determines a second such curve. The intersection of these two curves fully determines the position of the edge in the sensing plane. Preferably, the source region and both detector regions are all essentially line segments oriented parallel to a z-axis, the two detection regions being disposed axially but spaced from each other. Apparatus is also disclosed for determining a profile of edges on one side of the workpiece. Algorithms are disclosed for interrelating measurements taken on four sides of the workpiece, calculating coplanarity of the lead tips, and calculating tweezing coplanarity of the leads. Two calibration methods are also disclosed. Further apparatus is disclosed for rotating a workpiece by 90 degrees, for example, in order to scan leads on different sides of a package, without requiring any physical modifications for workpieces of different sizes.

79 Claims, 15 Drawing Sheets

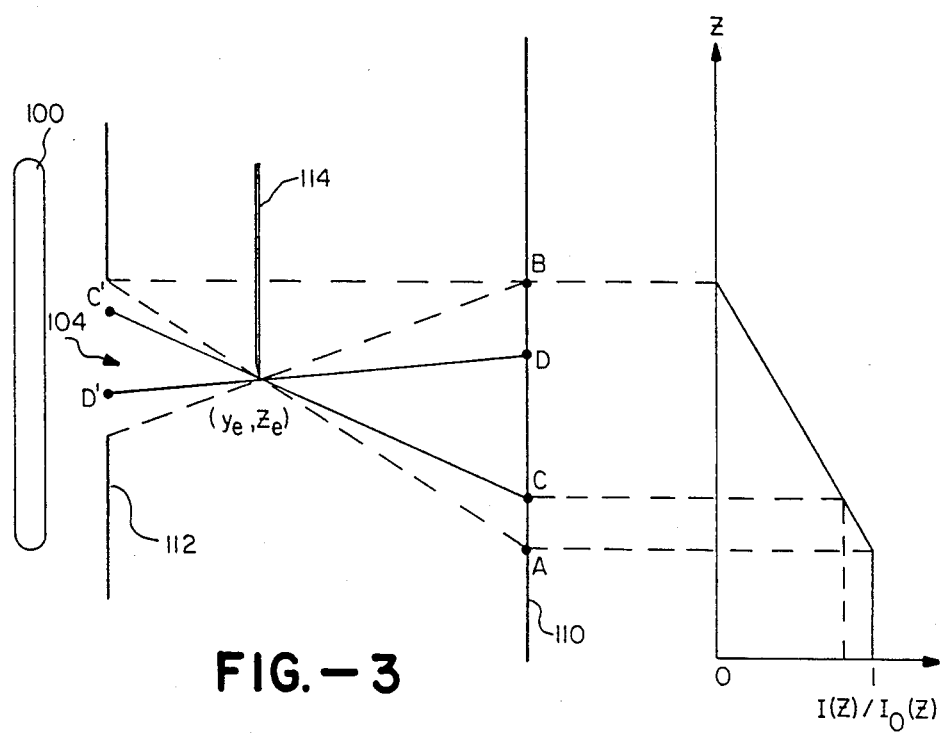
FIG.—3
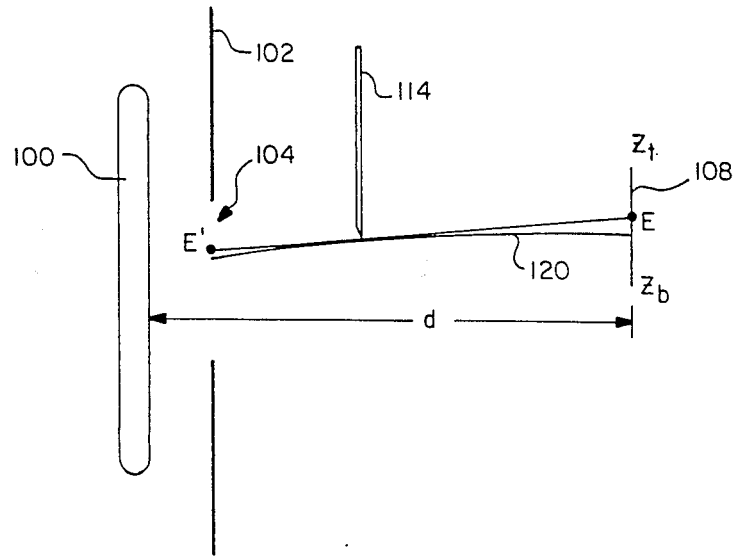
FIG.—4

FIG.—11

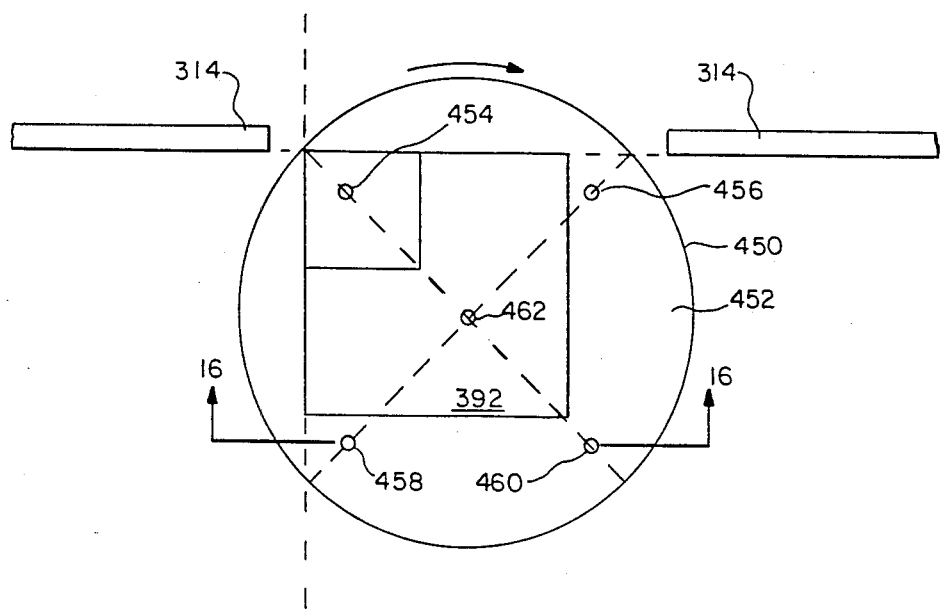
FIG.—15
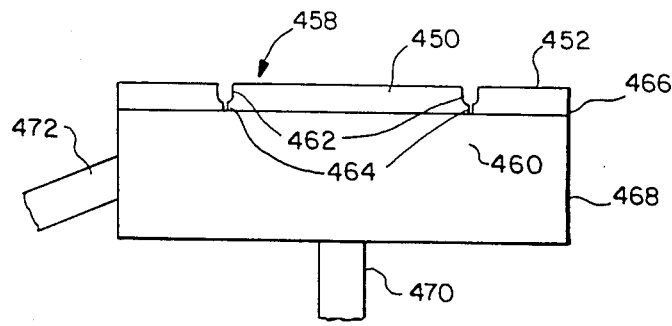
FIG.—16

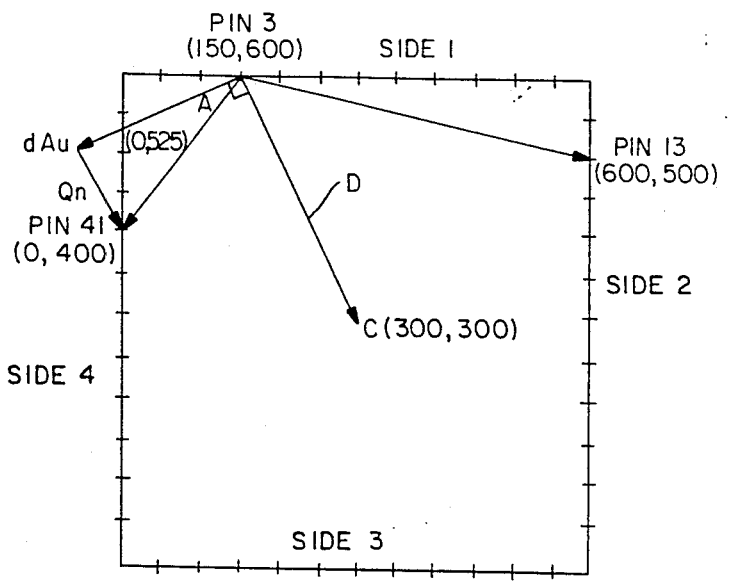
FIG.—20
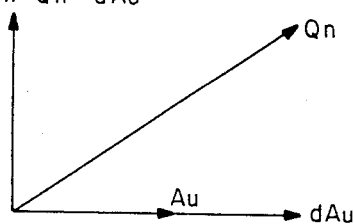
FIG.—21a
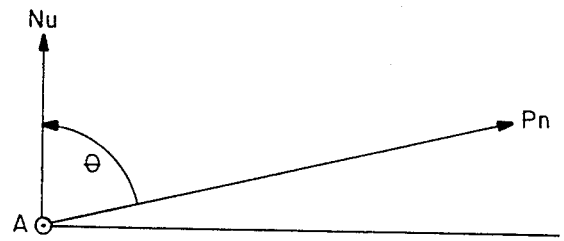
FIG.—21b
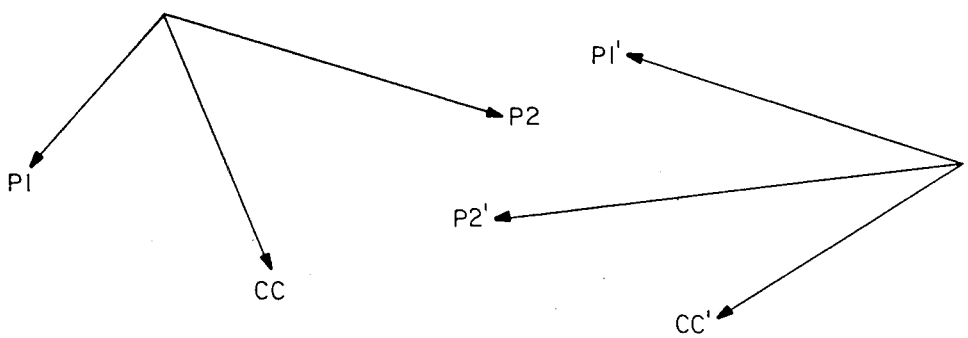
FIG.—22a   FIG.—22b

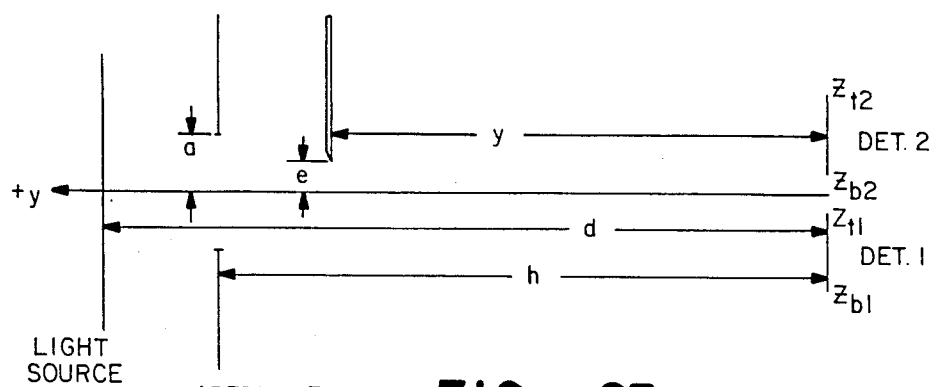
FIG.—23
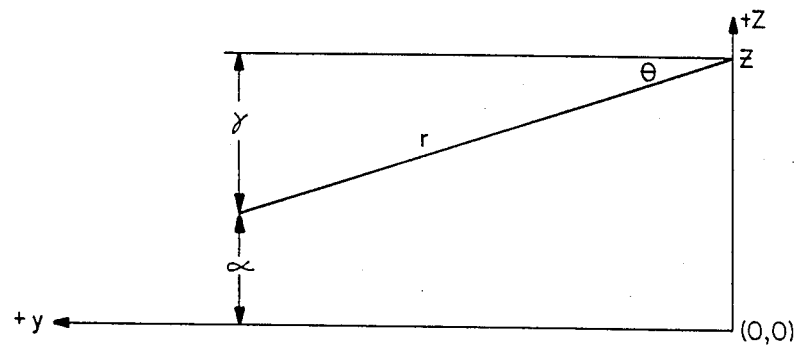
FIG.—24
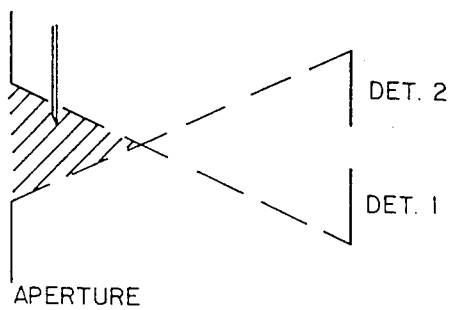
FIG.—25

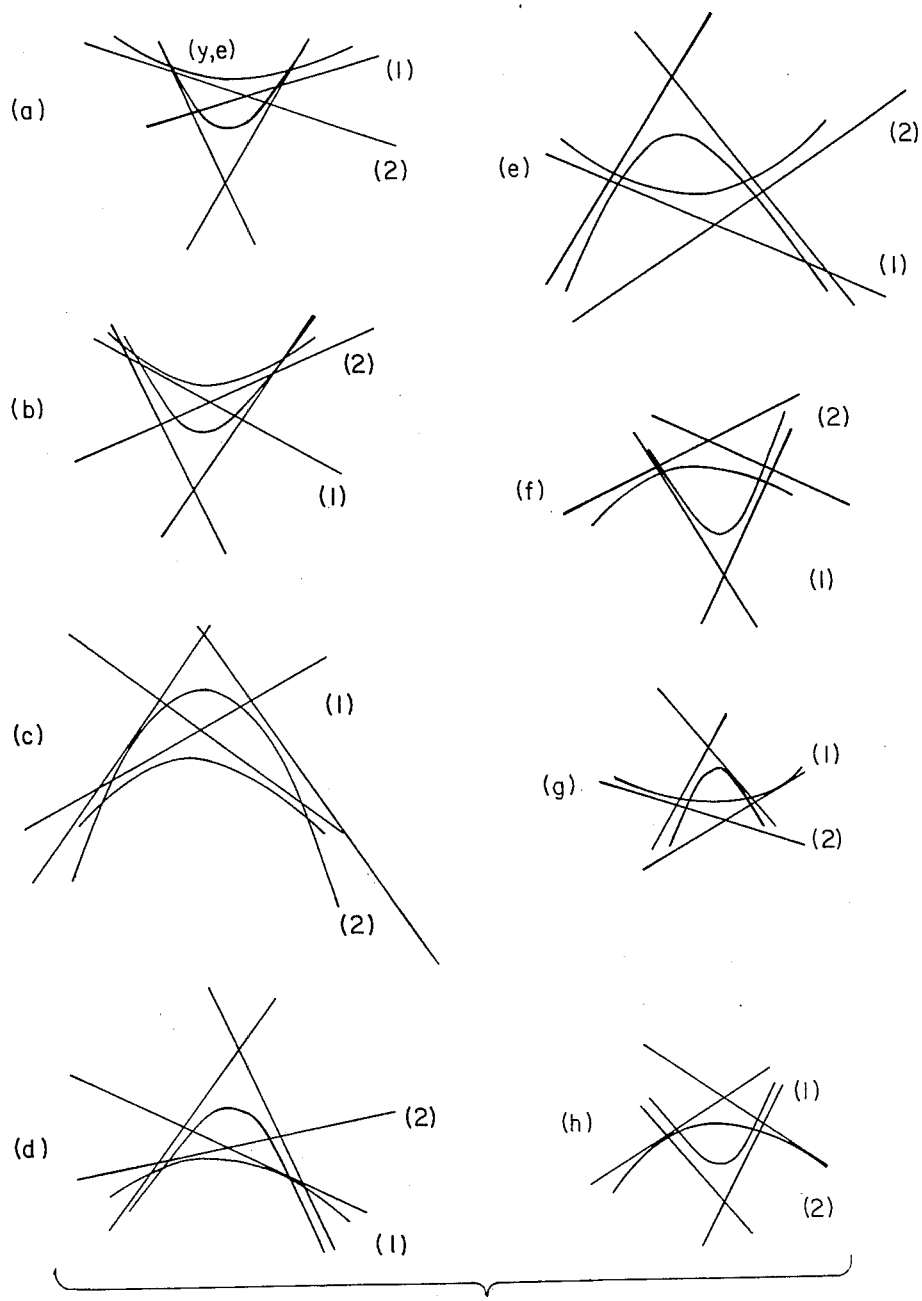
FIG.—26

NON-CONTACT HIGH RESOLUTION DISPLACEMENT MEASUREMENT TECHNIQUE

BACKGROUND

1. Field of the Invention

This invention relates to apparatus and methods for determining the spatial position of an edge of a workpiece, and more particularly to apparatus and methods for determining the spatial relationship between leads extending from an integrated circuit body to others of such leads and to the body, and methods and apparatus for using such position measurements to aid in quality control. In another aspect, this invention relates to devices for different sizes of workpieces to be rotated by a given angle without reconfiguration or adjustment.

2. Description of Related Art

For many applications it is desirable to mechanically determine the position of an edge on a workpiece with repect to a reference position. One such application is quality control, in which the position of an edge of a manufactured product is compared to the position of other edges of the product in order to ensure that the product is within certain specifications. Another application is in process control, in which the same function is performed at an earlier stage in the manufacturing process or at the end of the manufacturing process but in much finer detail. This permits adjustment of manufacturing parameters before the resulting component begins to exceed tolerance, or to warn of failing manufacturing apparatus before it actually fails.

An important application for the present invention is in the field of integrated circuit (IC) manufacture, where it is desirable to ensure the accuracy of the shape and position of the leads on the IC package. In this field, industry standards organizations, such as JEDEC, have promulgated specifications concerning certain types of packages, such as J-lead PLCC and small outline (SOIC) packages. These specifications are relied on by many different segments of the industry, including manufacturers of the printed circuit boards to which the IC's will be affixed, and manufacturers of pick-and-place machines for automatically placing IC's in their proper positions on a printed circuit board at high speeds.

An integrated circuit manufacturer usually has the task of keeping its output within the tolerance specified in the standards. These tolerances are often very tight as written, and in many cases the end users of the integrated circuits are beginning to require them to be even tighter. In addition, it is advantageous to the manufacturer if he can detect yet smaller deviations from the specified nominal positions in order to correct a gradually worsening problem in the manufacturing process before it ever reaches a severity necessary to cause rejection of any manufactured IC's for failure to meet the specified tolerances.

It is important to an IC manufacturer that the system which it uses to inspect IC leads have an accuracy which is as high as possible. The tolerance with which inspection measurements are made determine a region of uncertainty within which it is uncertain whether or not the product meets the tolerances specified in the industry standard. A cautious manufacturer should fail any product in the grey area. The higher the accuracy of the inspection system, therefore, the fewer good products will be rejected due to uncertainty. The quantity of these unnecessarily rejected products is a critical factor in the economic efficiency of such a machine.

The following definitions of terms will help the reader understand the invention and the description of the embodiments which appears below. Some of these terms relate mainly to J-lead IC packages, but it will be understood that the invention is not limited in application to such packages. It can be used not only with other types of electronic component packages, but also with workpieces completely outside the field of integrated circuits or electronics. The dimensions listed below are those that apply for a PLCC package with leads on 0.050" centers on all four sides.

Coplanarity

The distance between the seating plane of a multi-leaded component and a lead tip which does not contact the seating plane is the coplanarity distance of that lead tip. The seating plane is the plane on which the package will rest, leads directed downward, under the influence of gravity. Coplanarity is specified separately for each lead. The current maximum coplanarity tolerance is $-0.004"$. All coplanarity distances are defined as negative. For a J-lead, which has a rounded tip, the lead tip is defined as the point on the lead at which a tangent to the lead is parallel to the seating plane.

Sweep

The distance between the tips of adjacent leads on one side of a package. The tolerance on sweep is $\pm 0.004"$ with respect to an ideally precise array of pins.

Spread

The distance, in a direction toward or away from the package body, by which the center of a lead tip deviates from a line parallel to the body edge. The tolerance on spread is $\pm 0.008"$ with respect to an ideally precise array of pins.

Tweezing coplanarity

A measure of the coplanarity of the lead faces on a side of the package. A line drawn through the shoulders of the two leads on a subject side of the package which are the farthest from a datum line must not deviate from a line parallel to the datum line by more than $\pm 6$ mils. The datum line is defined as the line drawn through the center leads on the two sides of the package which are adjacent to the subject side.

A variety of different devices and methods have been used in the past to make these measurements. One technique is by human observation, a technique which is still in current use. For example, in order to measure coplanarity, a package is placed leads-down on a mirrored surface. The distance between each lead tip and its reflection is then visually inspected with an optical comparator to determine whether all the leads on a given side, and their reflections, are between a pair of reference lines. This technique has many obvious disadvantages including low throughput, low accuracy and high cost. Moreover, many of the specified parameters simply cannot be measured by human observation without detailed analysis requiring an inordinate amount of time to inspect each package.

Another technique often used to inspect the leads on IC packages involves air pressure measurement. An IC package is pressed into contact with the surface of a plate, and the spaces between leads are blocked as well as possible by mechanical means. Air is forced through a hole in the plate into the space between the package body and the plate, and the air flow between the plate and each of the lead tips is measured. This technique has a throughput comparable to that of the human means described above, since operator throughput is still a limitation. Similarly, accuracy and versatility are still a problem. With respect to versatility, it can be seen that an air pressure measurement technique is not readily adaptable for measuring other parameters which are specified in the standards. The technique as described does in a way provide a measurement of sweep and spread, but only to the extent that the sweep or spread affects the coplanarity of the lead tips. It does not provide these measurements independently of coplanarity.

A third technique for inspecting IC package leads is an imaging technique in which one or more video cameras are used to make video images of the leads. An anamorphic lens may be used to compress the image in the sweep direction and expand it in the Coplanarity direction to improve resolution for coplanarity measurements. Coplanarity and sweep measurements are made using four cameras, one directed toward each side of an IC package which rests on a horizontal plane with its leads facing upward. Spread is measured with a fifth camera positioned above the lead tips and directed toward the undersurface (base plane) of the package. It is believed that the measurements made for the four sides individually are interrelated (as they must be in order to determine certain of the parameters, such as coplanarity) through the use of a mechanical alignment procedure in which a calibration component is placed in the machine and the cameras or lens systems physically moved until alignment is achieved.

The imaging technique is a sophisticated technique with high flexibility in its application and relatively high accuracy. The sophisticated image processing algorithms required in this technique, however, render it extremely computationally intensive. Its throughput is limited by the processing power of the computer used to do the calculations. Additionally, an imaging system is not readily reconfigurable to handle different types or sizes of IC packages because any such change would likely require a change to different optic heads adapted for the new package. Imaging systems also suffer from depth-of-field problems and degradation of accuracy due to changes in surface finish or orientation.

A fourth technique is illustrated in FIG. 1. It involves a seating surface 10 having a hole 12 smaller than the size of the part 14 to be tested. A pedestal 16 depends through the hole, which pedestal has a mirror 18 on each of its four sides. The mirrors 18 are angled such that light directed onto them from above the seating surface and passing through the hole 12 will be reflected outward, away from the pedestal, in a known direction. The part 14 under test is inverted and raised until it rests in contact with the seating surface 10, its leads surrounding the hole. The light which is directed onto the mirrors 18 is divided into separate beams, one for each lead, the width of each beam being slightly narrower when it reaches the lead than the lead width, and directed so as to be completely blocked if the lead is positioned properly. If a given lead is not on the seating surface 10, the amount of light which gets past the lead depends on the distance between the surface 10 and the lead tip. The leads are themselves surrounded on all four sides by detectors 20, one for each lead, in such a position that any light which gets past the lead tip will be detected by the corresponding detector 20. Each detector 20 is located behind a light trap 22 consisting of a small aperture 24 and a darkened tunnel 26, to prevent off-axis light from reaching the detector.

The deliverable resolution of inspection devices which use the technique is very good. Since it measures coplanarity directly, however, it lacks the versatility to effectively measure other parameters. The device will fail a part for excess sweep, since anything more than slight misalignment between the lead and the beam will permit light to reach the detector from around the side of the lead. This is not very helpful if the manufacturer desires to quickly correct the problem in the manufacturing process which is causing the defect, however, because the inspection device cannot determine whether the defect is in coplanarity or sweep. The inclusion of this sweep detection capability also places a premium on the accurate placement of the part under test. If it is placed only slightly out of position, all the leads will be seen to have excess sweep and the part will fail. The need for accurate placement of parts under test limits the throughput which may be achieved.

In U.S. Pat. No. 4,553,843 to Langley and Brekka, there is disclosed a light blocking technique which may be used to inspect the leads on a body for conformance with a specified standard. The technique involves placing the IC package in a track or on a conveyor belt and moving it through a test area with a known velocity or acceleration. One or more light source-detector pairs are located in the test area, and positioned such that the light path between them traverses the expected position of the leads as the part moves along the track. By appropriate placement of the source-detector pairs, various different parameters may be measured by examining the output waveforms produced by the detectors as the part goes by. The embodiments described in the Langley and Brekka patent include source-detector pairs adapted to measure parallel and camber bending of the leads. The patent mentions that the sources may be essentially infrared point sources and the detectors may be phototransistors. Alternatively, point sources could be replaced by a light source (such as a laser) whose light is controlled to intersect an entire lead, and detectors replaced by a linear photodiode array. As another alternative a light source may be used which illuminates an entire side of leads while the part under test remains stationary. A sensor may be a TV camera that electronically scans the resulting picture of the leads.

This technique is highly versatile and is capable of high accuracy at high throughputs. However, after much time and effort was spent in attempts to increase the accuracy and/or throughput to still higher levels, it was finally determined that such increases are limited by the need for transport means which are steady enough to prevent unwanted motion when the part passes through the test area. Alternatively, it was found very difficult to hold the part steady and move the light sources and detectors without introducing unwanted motion of the part.

SUMMARY OF THE INVENTION

It is therefore an object of the present invention to provide a technique for detecting the position of an edge of a workpiece with respect to a reference position or another location on the workpiece.

It is another object of the present invention to provide apparatus for determining position information about leads extending from a body of a workpiece.

It is another object of the present invention to provide apparatus for obtaining interrelated position information concerning leads extending from four sides of a body of a workpiece.

It is another object of the present invention to provide apparatus usable with workpieces of different sizes, for rotating the workpiece by 90° without requiring reconfiguration or adjustment.

These objects and others are achieved according to the invention through the use of an entirely new method of determining position information about an edge of a test subject, involving illuminating the edge so as to create a shadow having a penumbra, and detecting the intensity of the light which reaches a known region in the penumbra. The test subject should be positioned such that light does not reach the known region from around any edge other than the edge being measured. By comparing the detected intensity with the intensity existing when the edge is absent (full intensity), or with the intensity detected when the edge is at a known position with respect to a reference position, it is possible to determine certain position information about the edge by means of formulae or calculations. Information obtained by other means may be used in conjunction with the mathematically determined information to thereby fix the position of the edge with respect to a reference position. It is most advantageous if the other means comprises means for detecting the intensity of light which reaches a second known region in the penumbra. If that intensity is compared with full intensity, or with the intensity detected in the second region when the edge is at a known position, additional position information may be determined as above. The coincidence of the two sets of position information determines where the edge must lie.

In the special case where the light source is essentially a line source lying parallel to a z-axis, and the detection regions are essentially line detectors in spaced axial relationship to each other, also lying parallel to the z-axis, then any reduction of the intensity of light which reaches either detection region indicates that the edge must be passing through the plane containing the line source and the two line detectors (the "sensing" plane). The intensity of light which reaches the first detector determines a first curve of possible points in the sensing plane through which the edge may pass, and the intensity of light which reaches the second detector determines a second curve of possible points in the sensing plane through which the edge may pass. The intersection of the two curves fixes the position of the edge in the sensing plane.

If the workpiece includes a protrusion (such as a lead on a body), and it is desired to measure the width of the protrusion, then two opposing edges on the protrusion may be simultaneously illuminated to create two penumbras. A comparison of the light intensity which reaches a known region in each of the two penumbras determines the width of the protrusion on an axis parallel to a line drawn between the two known regions.

The penumbra technique may be extended to determine a profile of several edges on one side of the workpiece by using a line source and two line detectors together defining a sensing plane as described above, then moving the workpiece approximately perpendicular to the sensing plane while measuring the edge position in the plane at measured intervals along the line of motion. An advantageous way of generating this relative movement is to hold the workpiece in a fixed position while moving elements of a position-measuring head relative thereto, the elements being chosen such that bouncing and vibration of these elements during scanning has little or no effect on the measurement being made. This permits high speed and high measurement accuracy at a minimum cost.

For example, the sense head may comprise a vertically oriented incandescent lamp with a line filament situated behind a first shield having a horizontal window spanning the length of the side of the workpiece to be measured; a second shield placed in front of the lamp, the second shield having a narrow vertical slit which crosses the horizontal window in the first shield vertically; two elongated detectors situated across the workpiece from the lamp and oriented horizontally, their major axes parallel to each other and to the side to be measured; and a third shield situated between the workpiece and the detectors, the third shield having a narrow vertical slit which crosses the two detectors vertically and which is substantially in-line with the filament of the lamp and with the vertical slit in the second shield; wherein only the lamp and the second and third shields move as scanning takes place. The movement of these elements need not be very accurate because the ends of the line source are defined by the vertical width of the horizontal window in the first shield, which is fixed, and because the detection regions in the penumbra are defined by the horizontal width of the vertical slit in the third shield, which of course remains constant as scanning takes place, and the vertical widths of the two detectors, which are fixed. Moreover, if the edge profile is used in such a way that individual points on the profile are examined in relation to each other, as opposed to an absolute position, then the apparatus according to the invention places no premium on accurate placement of the workpiece.

If the workpiece is an IC package, or similar electronic component package, which has leads extending from at least one side of a body, a profile of one leaded side of the package may be obtained as described above. The position of the lead tip centers may then be extracted and used to calculate the conformance of the package under test to various of the specifications set forth in a standard. This technique is capable of very high accuracy at very high throughputs.

According to the invention, if the workpiece is an IC package having leads (for example, J-leads) on four sides, four-sided measurements may be obtained by providing four sense heads along a path and moving the package under test sequentially through them. A 90° rotation table is located in the path between each consecutive pair of heads so that each head may scan the leads of a different one of the four sides of the package. The rotation table incorporates another aspect of the present invention. It provides the advantage of being able to rotate workpieces of different sizes by a predetermined angle without requiring any reconfiguration or adjustment. The table comprises a platform rotatable about an axis. In prior art rotation tables, the workpiece would be moved onto the center of the platform. According to the invention, however, the workpiece is moved onto the rotation table such that a first side of the workpiece always lies on a first line, the first line being spaced a first distance from the axis, and such that a second side of the workpiece adjacent to the first side always lies on a second line, the second line being spaced a second distance from the axis. (As used herein, the distance between a line and a point is determined according to the mathematical definition, i.e., the distance where the line passes most closely to the point.) The workpiece is held down on the table so that when the table rotates, the workpiece rotates with it. The first and second distances remain fixed for different sizes of workpieces, so that the first and second sides, and the corner between them, are always at the same location with respect to the axis. The position of the opposite corner varies for different part sizes, such that small workpieces do not pass through the axis at all, whereas very large workpieces do, and may even extend well beyond the radius of the rotation table (assuming sufficient holding force is provided). Holding force may be provided by suction holes in the platform. Advantageously, in order to minimize suction leakage, the suction holes may be located along a first diagonal passing through the axis and through the intersection of the first and second lines, and along a second diagonal also passing through the axis, but angled 90° from the first diagonal.

Once separate measurements are made for the leads on each of the four sides of an IC package, the four sets of measurements may be interrelated by a novel interrelationship technique involving ensuring that a line drawn through the *body* edge measurements on each side intersects with those of adjacent sides. To the extent they do not intersect, the z-positions of all the measurements made along one or more sides may be translated and/or rotated until closure is achieved. Since the line representing each body edge is extrapolated from the measured body edge points, it is not necessary that the body *corner* positions be measured for this technique to work.

In another aspect of the invention, a scanning head as described above may be calibrated using either or both of two innovative techniques. The two techniques may also be used in an iterative sequence. In the first technique, a calibration edge is placed in known positions in the active region of the y-z plane, and the various geometric parameters of the scanning head are permuted among several possibilities for each parameter until a minimum error is achieved. This is repeated for different x-positions of the scanning head and all optimizing parameter values are saved with reference to the x-position at which they were taken. In the second technique, for different x-positions, a calibration edge is placed in each of n (e.g., 100) z-positions immediately in front of the source aperture, and the actual light intensity received at each of the two detectors is measured. A table is then created for each such x-position, and for each detector at that x-position, which provides a correspondence between an index intensity on one hand and a correction constant on the other hand to be used when the index intensity is actually received at the appropriate detector. For example, the indices may be $I_{actual}/(I_{max}-I_{min})$ and the correction constants may be $I_{predicted}/I_{actual}$.

The four-sided measurements, as adjusted for interrelationship, may then be used to determine the coplanarity of lead tips. Using a unique mathematical technique which minimizes numerical error and improves computation speed, in another aspect of the invention the seating plane is determined by an iterative technique which emulates the events which occur when an IC package is lowered, leads down, onto a surface. The first pin to touch the surface will be the pin which is closest to the surface. The package will then roll toward the center of gravity about a roll axis determined by the line on the flat surface which passes through the first pin and is perpendicular to a line passing through the first pin and the center of gravity. The second pin to touch the flat surface will be on the same side of the first roll axis as the center of gravity. If a perpendicular is drawn from the first roll axis to each lead tip on the same side of the roll axis as the center of gravity, then the second pin will be the pin whose corresponding perpendicular makes the smallest angle with the flat surface. The line through the first and second pins is now the second axis of rotation and the package will rotate about this axis, again in the direction of the center of gravity, until a third pin touches the flat surface. If a perpendicular is drawn from the second roll axis to each lead tip on the same side of the second roll axis as the center of gravity, then the third pin will be the pin whose corresponding perpendicular makes the smallest angle with the flat surface. Thus the first, second and third pins form a triangle on the flat surface. If the triangle encompasses the center of gravity then the seating plane of the chip has been found; if not, the chip will once again roll towards the center of gravity, but this time about a new rotational axis. If the line through the first and third pins lies between the most recent roll axis and the center of gravity then it becomes the new axis of rotation; otherwise the line through the second and third pins is the new rotational axis. This settling process continues until the seating plane is found. If the center of gravity is located on a side of the triangle, then two seating planes exist and the chip can rock back and forth between them. The coplanarity procedure then determines whether any of the lead tip centers have a distance from the seating plane surface which is greater than the coplanarity limit.

BRIEF DESCRIPTION OF THE DRAWINGS

The invention will be described with respect to particular embodiments thereof. Reference will be made to the drawings, in which like elements are given like designations, and in which:

FIGS. 2, 3 and 4 diagrammatically show simplified apparatus according to the invention, useful for explaining its basic features.

FIGS. 15 and 16 show close up plan and side views, respectively, of the rotation table shown in FIG. 14.

FIGS. 20, 21a, 21b, 22a and 22b are diagrams useful for explaining the operation of the coplanarity algorithm.

FIGS. 23, 24, 25 and 26 are diagrams useful for explaining the mathematical derivation of formulas useful for implementing the invention.

DETAILED DESCRIPTION

Figure 1:
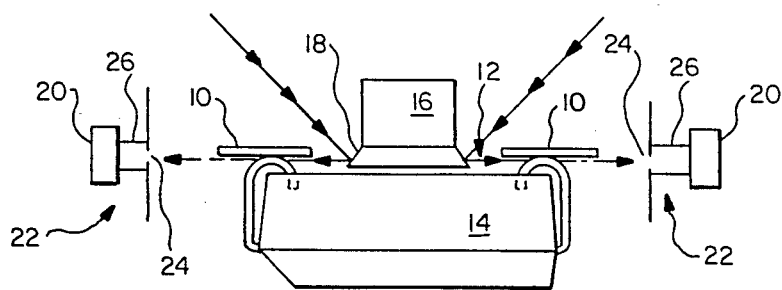
FIG. 1 shows a diagrammatical side view of a prior art structure.
Figure 2:
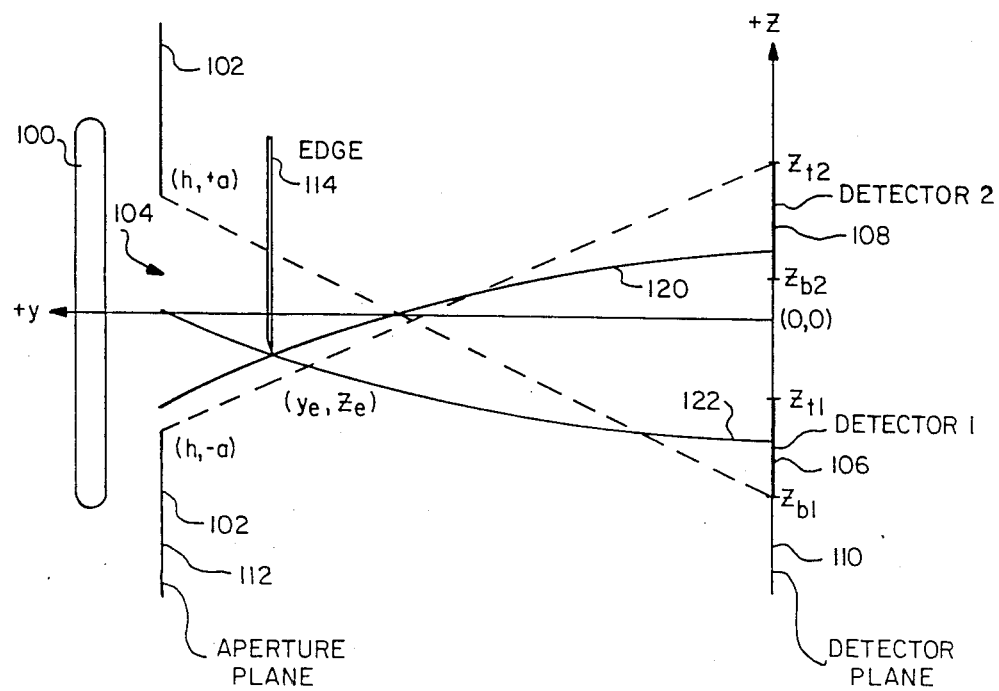

In FIG. 2 there is shown a simplified diagrammatical side view of apparatus according to the invention. It consists of a light source 100 blocked by a shield 102 having an aperture 104. The apparatus further consists of a first detector 106 and a second detector 108, both located in a detector plane 110. The light source 100 is essentially a line source whose ends are defined by the aperture 104, and the detectors 106 and 108 are essentially line detectors which are in a spaced-apart and end-to-end relationship with each other. The line source 100 and the two line detectors 106 and 108 all lie in the same plane, referred to herein as the sensing or y-z plane. The portion of the sensing plane which lies between the aperture 104 and the detector plane 110 will be referred to as the working space. For convenience, the sensing plane is given a y-z Cartesian coordinate system with the y-axis having its origin at the detector plane 110 and increasing toward the aperture 104, and with the z-axis having its origin in the center of the aperture 104 and increasing in the upward direction. The aperture 104 is considered to be $2a$ units in height and located in an aperture plane 112 defined by $y=h$. Thus the top and bottom extremities of the aperture 104 are located at $(y,z)=(h,a)$ and $(y,z)=(h,-a)$, respectively. Similarly, the detector plane 110 is defined by $y=0$, and the detectors have arbitrary top and bottom endpoints defined respectively as $(0, z_{t1})$ and $(0, z_{b1})$ for the first detector 106, and $(0, z_{t2})$ and $(0, z_{b2})$ for the second detector 108.

If there is no obstruction in the working space, all of the light which passes through the aperture 104 will reach the detectors 106 and 108. If there is an obstruction, such as a workpiece having an edge (shown in FIG. 2 as 114) located at a position $(y_e,z_e)$, then a shadow will be created on the detector plane 110. At a point on the detector plane 110 which is completely blocked by the edge 114 from the view of any part of the light source 100, the shadow is complete. That is, the light intensity is zero. At a point on the detector plane 110 which still has full view of all points of the source 100 (which are visible through the aperture 104), there is no shadow. That is, the light intensity is the same as that which would exist if the edge 114 were not in the working space. At points in between, from which the edge 114 blocks direct view of some but not all of the points of light source 100 visible through aperture 104, there will be a partial shadow. These points are referred to as being in the penumbra of the shadow created by edge 114.

In order to describe this mathematically, it is useful to consider each of the line detectors 106 and 108 as a series of point detectors. The effect that the source has on each of these point detector for a given edge position will then be integrated over the full length of the detectors to provide a practical result. It will be understood that a detector whose detection surface is truly a point, in the mathematical sense, does not exist in the real world; point detectors are used in this description only to explain the mathematics.

Referring to FIG. 3, with the edge 114 directed downward and located at a position $(y_e,z_e)$ in the working space, there is a point A on the detector plane 110 which is defined by the intersection of the detector plane 110 and a line passing through the top point of aperture 104 and the bottom point of the edge 114. All points below point A on the detector plane 110 have full view of all points of the source 100 which are visible through aperture 104. The intensity of light received at these points is unchanged from a full intensity level $I_0(z)$ normally received at these points when no edge is present. This is shown graphically to the right of the diagram in FIG. 3, as $I(z)/I_0(z)=1$. Similarly, there is a point B on the detector plane 110 which no longer has any direct view of any of the points of source 100 visible through aperture 104. All points above point B on the detector plane 110 receive zero intensity of light. (In practice some ambient level of light is received, but it may be ignored for the purposes of this explanation.) This is shown in the graph to the right of the diagram in FIG. 3 as $I(z)/I_0(z)=0$. At an arbitrary point C between points A and B the light intensity received will be somewhere between zero and full intensity, depending in some way on how much of the light source 100 visible through aperture 104 is still visible from point C under edge 114.

It can be seen that as the edge 114 moves up or down in the working space, the points A (where the entire source 100 visible through aperture 104 is visible) and B (where none of the source 100 is visible) will move up or down correspondingly. The graph, representing the light intensity at the detector plane, shown to the right of the diagram in FIG. 3 will also translate up or down. Thus the intensity of light received at a fixed point, such as known point C, will vary as the edge 114 moves up or down in the working space. The variation will be monotonic if the source 100 has a intensity profile which is nowhere zero.

The intensity of light received at point C will also vary as the edge 114 moves left or right in the working space, since such movement would expose more or less of the light from source 100 to known point C. The only movement which would not affect the light intensity received at point C is movement of the edge 114 along a line passing through C and through the edge 114, i.e., line C–C'. Thus a given intensity value received at point C determines not the absolute position $(y_3, z_e)$ of edge 114, but only a first relationship between $y_e$ and $z_e$. In the hypothetical case described above where the detector is a point C, the first relationship defines line C–C'.

For certain applications this may be sufficient. However, in the usual situation where it is desired to fully determine the position $(y_e, z_e)$, additional information about the edge 114 is needed. For example, the workpiece may be located in a track hving sufficient stability in the y direction such that the y position of the edge 114 in the working space is fixed. This y position may be inserted into the equation of the line C–C' to fully determine the position of edge 114 in the sensing plane. In applications where the y position of edge 114 is not known, the position of the edge 114 may be determined by the above method used in conjunction with any other technique for obtaining y and/or z position information about the edge 114. It is most advantageous if the other technique is the same as the first, since processing power and hardware may be pooled. This may be accomplished by detecting the light intensity which reaches a second point between points A and B on the detection plane 110, such as point D, to thereby determine a second line D–D' on which the edge must lie. The equations of the lines C–C' and D–D' constitute two equations in two unknowns, and solving them simultaneously will yield the position of the edge 114 ($y_e$, $z_e$) in the sensing plane.

Several things should be noted about this technique. First, since it depends on the existence of a penumbra, the portion of the light source 100 visible through the aperture 104 should not be the equivalent of a point source. A non-zero dimension is required at least parallel to the direction in which different penumbra values are desired. Second, there is no requirement that the detectors be physically located at the regions on the detection plane 110 where the incident light intensity is to be measured. Light which reaches these regions may be transmitted to remote detectors via, for example, optical fibers or mirrors.

Third, the use of a shield 102 having an aperture 104 is not essential to the basic penumbra technique. As explained more fully below, however, it does provide certain advantages: it clearly defines the top and bottom ends of the light source, masking the gradual transition to zero intensity which usually exists at the extremities of a source such as 100; it provides a physically measurable height for the line source; and it provides a means for tolerating up-and-down vibration of the source 100 as the source 100 and the sensing plane are moved in the x-dimension in order to obtain an edge profile. But if these functions are not important in a given embodiment, or if other means are provided to perform these functions, then the shield 102 and aperture 104 may be eliminated.

Fourth, the system need not operate in the range of visible light. Other frequencies of electromagnetic radiation may be used instead, such as infrared or ultraviolet light. Excursions into microwave or X-ray frequencies would probably require different types of detectors, but as long as the material of edge 114 is opaque enough at the frequency chosen, the basic penumbra technique could still be used. Non-electromagnetic radiation could also be used, such as ultrasound, though the governing wave propagation principles and the resulting mathematics would differ considerably from those for electromagnetic radiation.

Returning to FIG. 2, it can be seen that the detectors 106 and 108 are essentially line detectors. Instead of generating a signal indicative of the intensity received at a single point, each of the detectors 106 and 108 generate a signal indicative of the sum of the light intensities received at all points on the detector. Like the hypothetical point-detector situation, the intensity values received by each detector 106 and 108 determines one curve in the sensing plane on which the position of the edge 114 must lie and their combined usage fixes the position entirely. However, the y-z relationship determined by each of the detectors 106 and 108 is not a simple straight line as was the case with the point detectors. This can be seen by referring to FIG. 4, which shows the light source 100, the shield 102 with its aperture 104, the edge 114 in an arbitrary position in the sensing plane, and only one line detector, detector 108, in the detector plane. Choosing an arbitrary point E on the line detector 108, it can be seen that any motion of the edge 144 along the straight line defined by E-E' (see FIG. 4) will have no effect on the light intensity received at point E. However, the light intensity received at the points on the detector 108 above and below point E will vary. Moreover, an increase in the intensity received at a point above point E is not exactly counteracted by a decrease in the intensity received at a point below point E. This is because of Lambert's Cosine Law, which states that the intensity of light received at a detection point from a light source is proportional to the cosine of the angle between the normal to the detector surface and the line between the source and detector. The intensity received at the detection point is also proportional to the inverse square of the distance between the source and the detection point. Thus, considering each of the points of source 100 visible through aperture 104 as a separate point source, the total illumination on a detector extending from $z_b$ to $z_t$ is:

$$I = \int_{z_b}^{z_t} \int_{\alpha_1(z)}^{\alpha_2(z)} \frac{k\cos\theta}{r^2} \, d\alpha \, dz$$

where $[\alpha_1(z), \alpha_2(Z)]$ is the portion of the source 100 which is visible from the point z on the detector, and $\theta$ and r are:

$$r = \sqrt{d^2 + (z - \alpha)^2} \; ; \; \theta = \cos^{-1} d/r$$

The symbol d indicates the distance between the source 100 and the detector plane 110.

In the Appendix there is a mathematical analysis of the apparatus shown in FIG. 2. The analysis shows that the above double integral defines an hyperbola with focii at the two endpoints of detector 108. That is, a given intensity reading from detector 108 indicates that the edge 114 lies on an hyperbola such as that designated in FIGS. 2 and 4 as 120. Similarly, the intensity received by the detector 106 determines a second hyperbola on which the edge 114 must lie, the second hyperbola designated in FIG. 2 as 122. The intersection of these hyperbolae fixes the position of the edge 114 in the sensing plane.

The Appendix contains a mathematical derivation showing that the edge position ($y_e$, $z_e$) can be calculated directly from the intensity values $I_1$ and $I_2$ received at the first and second detectors 106 and 108, respectively. This may be accomplished as follows, using computer language notation:

```
hsqr = sqr(h);
Zmid1 = (Z_t1 + Z_b1)/2;
Zheight1 = Z_t1 - Z_b1;
illfull1 = I_open1 - I_min1;
Zmid2 = (Z_t2 + Z_b2)/2;
Zheight2 = Z_t2 - Z_b2;
illfull2 = I_open2 - I_min2;
minus_a_term1 = sqrt(hsqr + sqr(Z_t1 - a)) -
    sqrt(hsqr + sqr(Z_b1 - a));
plus_a_term1 = sqrt(hsqr + sqr(Z_t1 + a)) -
    sqrt(hsqr + sqr(Z_b1 + a));
minus_a_term2 = sqrt(hsqr + sqr(Z_t2 - a)) -
    sqrt(hsqr + sqr(Z_b2 - a));
plus_a_term2 = sqrt(hsqr + sqr(Z_t2 + a)) -
    sqrt(hsqr + sqr(Z_b2 + a));
k1 = -illfull1/(minus_a_term1 - plus_a_term1);
k2 = -illfull2/(minus_a_term2 - plus_a_term2);
ill1 = I_1 - I_min1;
ill2 = I_2 - I_min2;
v1 = -ill1 / k1+ plus_a_term1;
v1sqr = sqr(v1);
v2 = -ill2 / k2+ plus_a_term2;
v2sqr = sqr(v2);
b1 = sqr (Zheight1) - v1sqr;
b2 = sqr (Zheight2) - v2sqr;
aa = v2sqr * b1 - v1sqr * b2;
bb = -2.0*(v2sqr * b1 * Zmid1 - v1sqr * b2 * Zmid2);
cc = v2sqr * b1 * sqr(Zmid1) - v1sqr * b2 *
    sqr (Zmid2) - (b1 - b2) * v1sqr * v2sqr / 4.0;
discriminant = sqrt(sqr(bb) - 4.0 * aa * cc);
```

```
        -continued
sign = v1 * v2 * (Zmid1 − Zmid2);
if (sign > 0.0) {
  if (bb > 0.0)
     z = (2.0 * cc) / (−bb − discriminant);
  else
     z = (−bb + discriminant) / (2.0 * aa);
}
else {
  if (bb > 0.0)
     z = (−bb − discriminant) / (2.0 * aa);
  else
     z = (2.0 * cc) / (−bb + discriminant);
}
y = sqrt(b1 * (sqr(Zmid1 − z) / v1sqr − 0.25));
```

Numerous variations on the above approach are possible. For example, account may be taken of the additional factor that the intensity of light detected at a detection point is also dependent on the angle of incidence of the light on the detector. This would require replacement of the cos term in the above double integral with a $\cos^2$ term. As another example, empirical data may indicate that the source 100 does not emit light uniformly throughout its length. Empirical data may also indicate that the detectors 106 and 108 do not respond uniformly to the same light intensity incident upon different detection points, or do not respond linearly to different light intensities incident upon a given detection point. One way to take this into account would be to approximate these nonuniformities in the form of an equation, and build that equation into the double integral set forth above. The equation might, for instance, be modified by adding a second-order term such as the following:

$$I = \int_{z_b}^{z_t} \int_{a_1(z)}^{a_2(z)} \frac{k\cos\theta}{r^2} + \frac{\xi\sin^2\theta}{r^2} \, da\, dz$$

As another example, the mathematics may be avoided altogether by defining an active portion of the sensing plane, outside of which the position of edge 114 is not important, and then dividing the active portion of the sensing into numerous y and z increments. By experimentally placing a calibration edge at each possible position in the active portion, and reading and storing the intensity values received at the two detectors 106 and 108 for such edge position, a large lookup table may be created. When the device is in operation, with an edge 114 at an unknown position in the active portion of the sensing plane, the intensity values received at detectors 106 and 108 may simply be compared to the intensity values stored in the table to determine the y and z position of the edge 114. It should be noted, however, that any drift in light intensity which changes the distribution of light from the filament would likely degrade the resolution of a system using such a table.

As yet another example, equations such as those described above may be used, though modified by a calibration procedure. Such a procedure is described below.

In the practical application of apparatus such as that shown in FIG. 2, it should be noted that the mathematics assumes an ideal source distribution consisting of a line of constant intensity which goes to zero at its ends in a very short distance. This is difficult to achieve in an incandescent source, since the ends of the filament usually have a smooth temperature transition. The use of the shield 12 with aperture 104 solves this problem since it blocks any light from portions of the source which are not at the uniform temperature. Thus, the source 100 should be long enough in the z-dimension that a line drawn through (0, $z_{t2}$) and (h, −a) intersects an active portion of the source 100 (see FIG. 2), as should a line drawn through (0, $z_{b1}$) and (h, a). As shown in the Appendix, the distance between the light source 100 and the shield 102 plays no part in the calculations. Additionally, the source should be point-to-point linear and should have a high stability and long life for commercial applications. The use of an incandescent lamp with a single linear filament has been found sufficient for source 100. Additionally, the source should be powered by a well-regulated DC current or voltage source.

It should also be noted that, though the discussion above has been concerned with a geometrically ideal sensing plane, practical sensing planes cannot have zero thickness. That is, the source 100 and the detector regions 106 and 108 must have a thickness in a dimension orthogonal to the y-z plane (referred to herein as the x-dimension). The thicker these components are in the dimension orthogonal to the y-z plane, the more light is received by the detectors 106 and 108. However, the narrower the components are in the x-dimension, the finer the detail that can be obtained for different points on an edge extending in that dimension. It is important that the components be narrower in the x-dimension than the edges being measured in order to ensure that light reaching the detectors is only that light which is in the same z-plane as the edge to be measured, not the light which comes from other z-locations. (The beam of light may be referred to hereinafter as a "knife" of light, in reference to its narrow width).

It should further be noted that both detection regions must be wholly within the penumbra. The full-light and full-dark zones must not impinge on either detector, or the mathematical analysis described above will not apply. The above-described system therefore defines a working area in the sensing plane, the working are being a triangle having its three sides defined by (1) the light source aperture plane; (2) a line drawn from the top of the top detection region to the bottom of the source aperture; and (3) a line drawn from the bottom of the bottom detection region to the top of the source aperture. If the edge is not within this triangle then either a full-light or a full-dark zone is impinging on one of the detection regions and the above-derived formulas will not work. Additionally, a penumbra is always less precise at its edges. It is therefore preferred that the edge be within a practical working area which is narrower than the theoretical working area triangle defined above. Finally, only one edge of the object under test may be within the working area. This limits the width of objects whose edge position is to be measure.

Scanning Head

In another aspect of the invention, the basic penumbra concept can be extended to determine a profile of edges on one side of a workpiece. For example, if the workpiece is a J-lead PLCC, then the y and z positions of a plurality of points at different x-positions on one side of the PLCC may be obtained. By knowing the relative positions of the y-z plane with respect to the workpiece when the various intensity readings are taken, the x, y and z coordinates of each such point can be determined.

Figure 5:
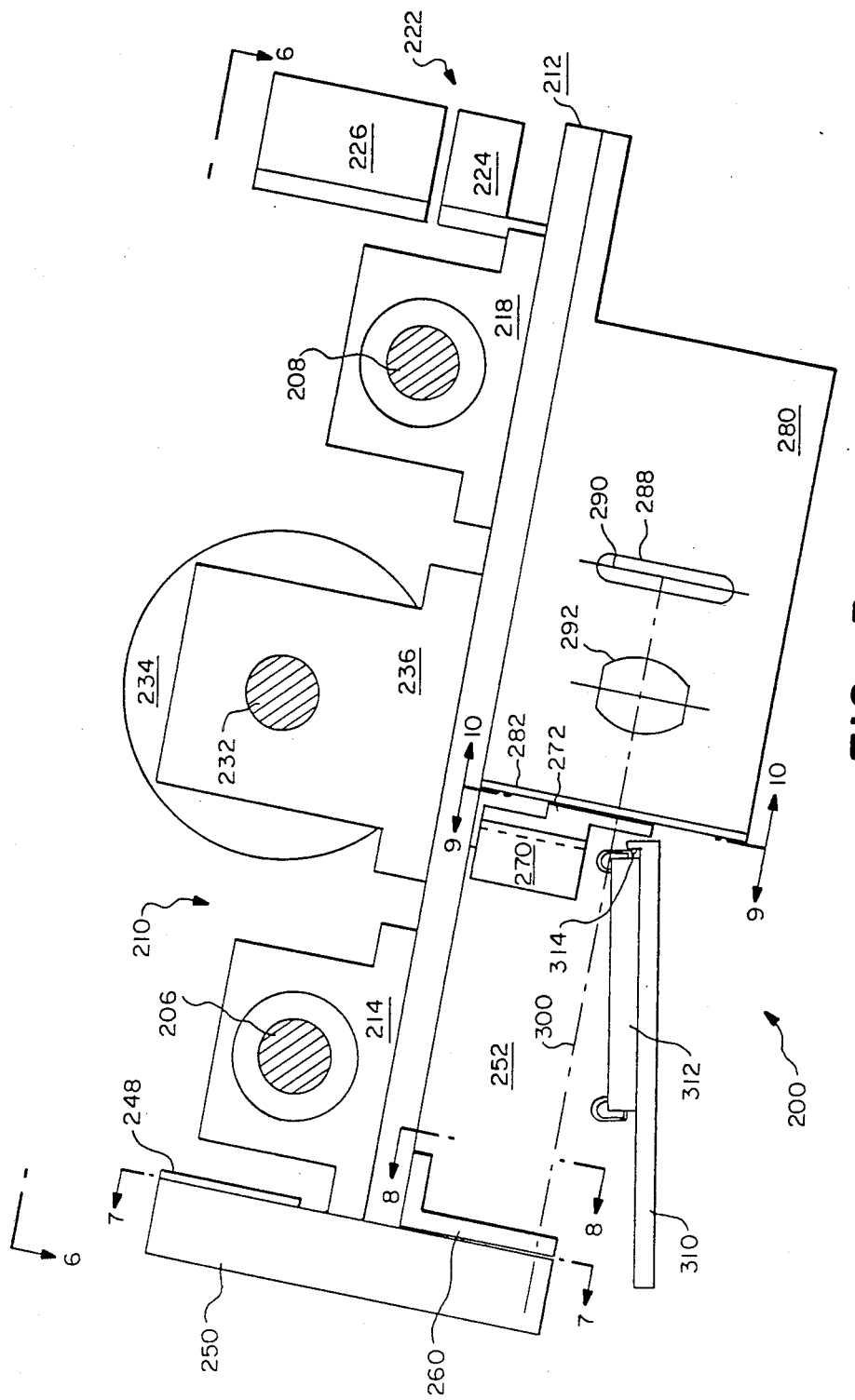
FIG. 5 shows a side view of scanning head apparatus according to the invention.
Figure 6:
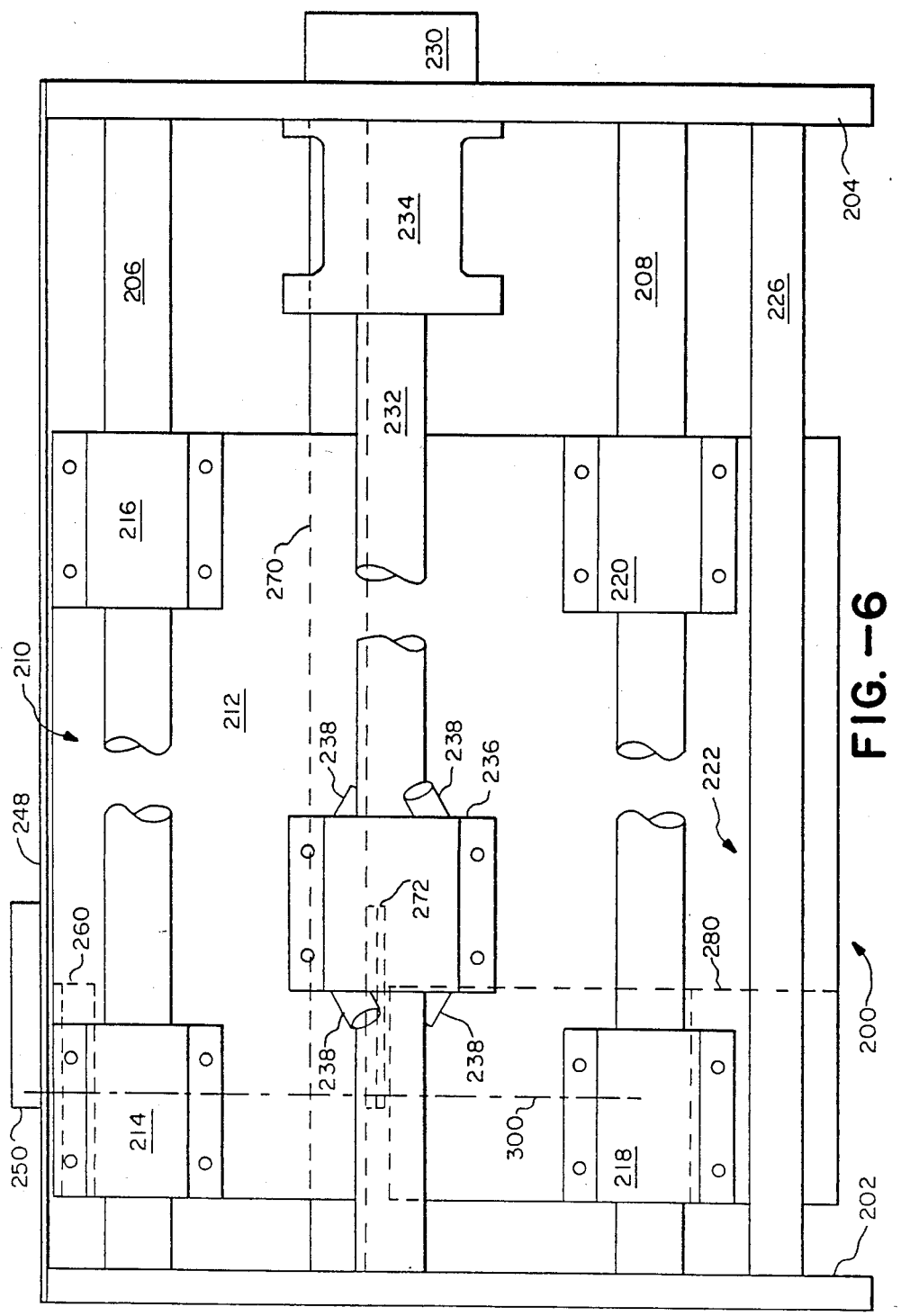
FIG. 6 shows the apparatus of FIG. 5 in plan view.

In FIGS. 5 and 6 there is shown apparatus 200 which may be used according to this aspect of the invention. FIG. 5 is a side view of the apparatus 200 and FIG. 6 is a plan view of the same apparatus. Where a feature is visible on both Figures, it is given the same reference numeral. Referring first to FIG. 6, the apparatus 200 includes two vertical support pieces 202 and 204 (not shown on FIG. 5) which are held erect by mounting brackets (not shown). A mounting plate 248 is attached to vertical supports 202 and 204 at the back thereof. Two linear bearing shafts 206 and 208 each span the distance between the two vertical supports 202 and 204. A carriage assembly 210 travels left and right on the FIG. 6 diagram along the linear bearing shafts 206 and 208. The carriage assembly 210 consists of a carriage plate 212, which is generally rectangular, and four linear bearings 214, 216, 218 and 220 affixed to the top surface of the carriage plate 212. The linear bearings 214 and 216 ride on the linear bearing shaft 206, and the linear bearings 218 and 220 ride on the linear bearing shaft 208 so that the carriage assembly 210 may travel a distance of about three inches in the horizontal direction, at least two inches of which are at constant velocity. Also mounted on the carriage plate 212, is a linear encoder 222 consisting of an encoder read head 224 mounted on the plate 212 and an encoder scale 226 mounted fixedly between the two vertical supports 202 and 204. The linear encoder 222 is a device which optically detects the passage of the encoder read head 224 past numerous fine markings on the encoder scale 226. It outputs a pulse for every 50 microinches of travel, as well as a signal indicating when the carriage is at an absolute zero x-position. The latter is needed to correlate calibration information (described below) to measured information.

Mounted on the side of vertical support 204 opposite the carriage assembly 210 is a servo motor shown representatively in FIG. 6 as 230. The servo motor 230 (which may instead be another type of electric motor) has a rotatable shaft 232 which extends through the vertical support 204, through a bearing housing 234 and across the region containing the carriage assembly 210 to the opposite vertical support 202. The rotatable shaft 232 passes through a linear actuator 236 which is attached to the carriage plate 212. The linear actuator 236 includes six bearings 238 which are essentially short, rotatable shafts projecting from the linear actuator 236 at a helical angle to the rotatable shaft 232. The surfaces of actuators 238 roll against the surface of rotatable shaft 232 such that rotation of rotatable shaft 232 will cause the linear actuator 236, and therefore the entire carriage assembly 210, to move left or right, depending on the direction of rotation of rotatable shaft 232, along the shaft. See U.S. Pat. No. 3,272,021, which is incorporated herein by reference. It will be understood that this linear actuator means is only one of numerous possible means which may be employed for moving the carriage assembly 210. The linear actuator arrangement, however, is considered advantageous since it permits smooth, efficient movement of the carriage 210, and can be adjusted to slip without damage at a desired thrust load (jam).

Figure 7:
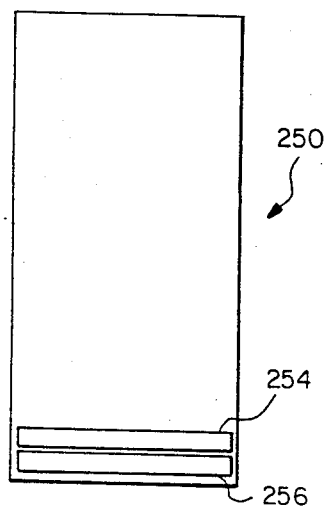
FIGS. 7, 8, 9 and 10 show frontal views of various components of the apparatus of FIGS. 5 and 6.

Referring to both FIGS. 5 and 6, there is shown attached to the mounting plate 248, on the rear surface thereof, a detector/amplifier assembly 250. At the bottom of the detector/amplifier assembly 250, on the face thereof facing a working space 252 under the carriage plate 212, are the exposed surfaces of two elongated detectors 254 and 256 (see FIG. 7). The detector surfaces 254 and 256 are essentially rectangular in shape, each approximately two inches in width and 100 mils in height. The detector/amplifier assembly also includes a printed circuit board (not shown) connected to the detectors 254 and 256, the contents of which will be described below.

Figure 8:
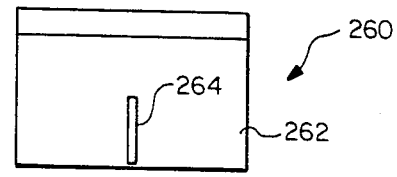

Attached to the undersurface of carriage plate 212 and disposed adjacent the face of detector/amplifier assembly 250 which contains detector surfaces 254 and 256 is a shield 260, shown facially in FIG. 8. It is basically an opaque surface 262 with a vertical slit 264 cut into it. The slit 264 is approximately 20 mils in width and taller than the vertical height of the two detector surfaces 254 and 256 taken together. The shield 260 is disposed directly in front of the detector/amplifier assembly 250 such that it completely covers the detector surfaces 254 and 256 except for any portion exposed by the slit 264. The slit 264 is situated to extend both above and below the detector surfaces 254 and 256 and to travel, as the carriage assembly 210 travels, between substantially the left and right ends of detector surfaces 254 and 256.

Figure 9:
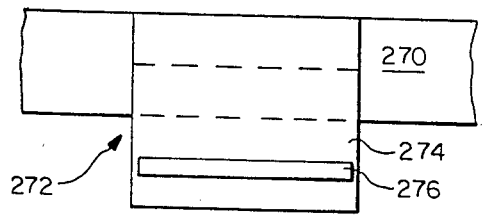

On the other side of working space 252 (see FIG. 5) there is a crossbar 270 which is attached at either end to vertical support 202 and 204 such that it remains stationary while the carriage assembly 210 moves. Fixedly attached to the crossbar 270 is a shield 272 shown facially in FIG. 9. It consists of an opaque surface 274, which may be made of aluminum, having a horizontal opening or aperture 276 located in a portion of the shield 272 extending down below the crossbar 270. The aperture 276 is approximately two inches wide and 100 mils tall. It is desirable that the top and bottom edges of aperture 276 be as straight and parallel as possible.

Figure 10:
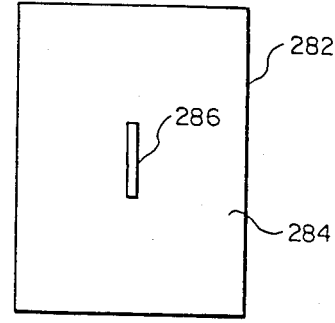

Hanging from the undersurface of carriage plate 212, immediately behind the shield 272 when viewed from the working space 252, is an optic projector assembly 280. The front of the optic projector assembly 280 includes another shield 282, which is shown facially in FIG. 10. Like shield 260, shield 282 consists of an opaque surface 284 in which there is cut a narrow slit 286. The slit 286 is approximately 8 mils wide Optic projector assembly 280 is disposed such that the shield 282 is positioned directly behind the shield 272, the slit 286 in shield 282 crossing the aperture 276 in shield 272 vertically. The slit 286 extends both above and below the top and bottom edges of aperture 276 and is situated such that travel of carriage assembly 210 causes the slit 286 to travel between substantially the left and right ends of aperture 276. The optic projector assembly further includes, internally, a filament lamp 288 having its filament 290 oriented substantially in the same direction as the slit 286 in shield 282, and an optional collimating lens 292 situated between the filament lamp 288 and the shield 282. The lens 292 effectively collimates the light from lamp 288 to a degree, to help eliminate reflections caused by internal curvature of the leads of PLCCs and also reflections from other parts of the component. The collimating effect of the lens also aids in creating the narrow optical knife. The filament lamp 288, the lens 292, the center of slit 286 in shield 282 and the center of slit 264 in shield 260 are all lined up to form an optical center line shown in FIGS. 5 and 6 as dash-dot line 300. The optical center line 300 also forms the y-axis of the system. The z-axis of the system lies substantially in the surface of detector shield 260 which faces the working area 252, and lies parallel to the slits 264 and 286 in shields 260 and 282, respectively. An x-axis is defined as being perpendicular to both the y and z axes, and directed right-to-left in FIG. 6 (out of the page in FIG. 5).

As seen in FIG. 5, the entire assembly is tilted from the horizontal. This is so that readings may be taken of the edges of one side of a workpiece without having interference from the opposite side. Also shown in FIG. 5 is a platform 310 whose surface is substantially horizontal, and on which appears a workpiece, in particular a PLCC 312 oriented leads-up, the shoulders of the leads of one side being flush with a reference guide wall 314 which is attached to the platform 310. The workpiece 312 is held in place by suction means (not shown). It can be seen that since the J-leads of the PLCC 312 have rounded tips, the tilt angle of the apparatus 200 should be kept as small as possible; otherwise the positions of points measured will be other than those on the lead tip. An angle of 10° has been chosen as a good compromise between this consideration and the need to avoid interference with the light beam by pins on the opposite side of the package.

Figure 11:
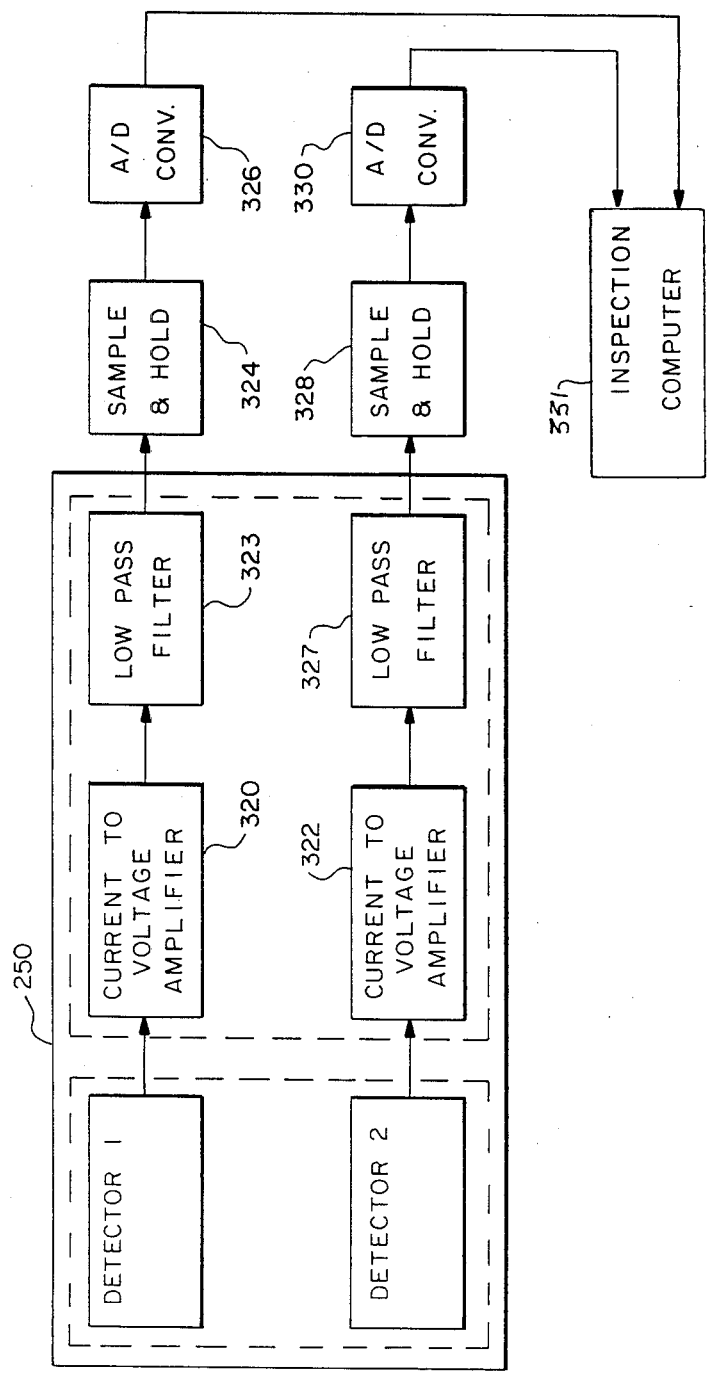
FIG. 11 shows a block diagram of an electronic circuit which forms part of the apparatus of FIGS. 5 and 6.

The data acquisition system includes the following circuitry. Referring to FIG. 11, the dual detectors having surfaces 254 and 256 (FIG. 7) are connected separately to amplifiers 320 and 322. The output of amplifier 320 is connected to low pass filter 323, the output of which is connected to a sample and hold circuit 324, the output of which is connected to an analog to digital converter 326. The output of amplifier 322 is connected to low pass filter 327, the output of which is connected to a sample and hold circuit 328, the output of which is connected to an analog to digital converter 330. The amplifiers 320 and 322 each contain potentiometers (not shown) for trimming their gain as required, since the responsivity of the detectors is not necessarily the same. The outputs of analog to digital converters 326 and 330 are made available to an inspection computer (331)

The operation of the apparatus 200 will now be described. As shown in FIG. 6, the carriage assembly 210 is in its full left position. Since the optic projector assembly 280 and the shield 260 are attached to the carriage plate 212, they too must be in their full left position. They define an optical center line 300 which passes through the aperture 276 in shield 272 and reaches detector surfaces 254 and 256 at the far left. (See FIG. 6, which shows the elements below the carriage plate 212 in dotted lines.) A workpiece such as PLCC 312 is placed on the platform 310 and pressed up against the guidewall 314. The workpiece is located in an x-position which is just behind the optical center line 300 (FIG. 5), or to the right of the optical center line 300 in FIG. 6. The servo motor 230 is then activated, causing linear actuator 236 to begin moving the carriage assembly 210 to the right. As it moves, linear encoder 222 outputs relative information every 50 microinches. In addition, a single absolute zero location is output. The outputs are fed to a trigger circuit which qualifies triggering pulses to the A/D. In order to correlate certain calibration information (as described below) to measured intensities, true X position must be known. The trigger circuit will generate position pulses within a definable window along the x-axis that are absolutely referenced to the zero location. The relative incremental spacing between position pulses is programmable. Likewise, the offset between the beginning of the measurement window and absolute zero is programmable. The output of the A/D is stored in consecutive memory locations of a memory block for a scan of one side of a part under test. A one-to-one correlation between the trigger circuit output pulses in the measurement window and memory locations in the A/D memory block exists. Therefore, the measurements stored in the A/D memory block correspond to known physical X positions. This data is then made available via a bus (not shown) to the inspection computer (not shown). The digital outputs of analog to digital converters 326 and 330 bear a substantially linear relationship to the intensity of the light which was detected on the detection surfaces 254 and 256 (FIG. 7) when the linear encoder 222 generated its pulse.

As the servo motor 230 continues rotating, the carriage assembly 210 continues moving across the apparatus 200 and successive intensity readings are taken and made available to the inspection computer. Along its total distance of constant velocity travel of about two inches, the optical center line 300 passes along the full length of the side of PLCC 312 which is flush with guidewall 314. As will be seen, the intensity readings taken effectively describe the x, y and z positions of successive points of the edge profile along this side. This includes points on the lead tips, points on the body edge as seen between the leads, as well as the vertical sides of the leads. For each pair of intensity readings, the inspection computer (not shown) determines the y- and z-positions of the edge of PLCC 312 which partially blocks the light beam at that particular x-position, using the formulas discussed above.

As the optical center line 300, and therefore the y-z plane, moves in the x direction, it is important that the movement be of a substantially constant velocity. A constant velocity produces pulses to generate a fixed sampling frequency in the A/D system. The frequency is selected to be high enough to reproduce the details of the leads as required. Aliasing errors can be introduced when the sampling frequency conflicts with the higher frequency elements of the input waveform from the detectors. These errors are reduced to insignificant levels by passing the waveform through a low pass filter prior to measurement. Effective spectrum amplitude management is achieved by generating a predictable carriage velocity and choosing a fixed distance between trigger pulses. It is also important that the movement of the optical center line in the x-dimension be wobble-free. Any vibration or deviation of the effective source region and active portions of the detector regions, however such regions may be bounded, in the y or z direction with respect to the position of the workpiece will significantly degrade the results. This is especially true where, as here, it is desired to measure the y and z positions to accuracies of approximately 50 microinches. Unwanted movement in the y or z direction with respect to the workpiece, by as little as 50 microinches, will be read as a variation in the y or z position of the edge being measured.

One way to accomplish steady movement is through the use of expensive and difficult to operate mechanical apparatus. The use of fixed and moving apertures according to the invention, however, avoids the need for such an implementation. On the source side of working space 252 it can be seen that the optic assembly 280, including the filament lamp 288 and the shield 282 with its vertical slit 286 do move with the carriage assembly 210, but the shield 272 with its horizontal aperture 276 remains fixed. This has the effect of moving the region from which light is emitted without moving the top and bottom edges of such region. Additionally, since the shield 282 with its vertical slit 286 are behind the shield 272 (as viewed from the working space 252), the fixed shield 272 also defines the y position of the region from which light is emitted. The movement of the filament lamp 288 and slit 286 need not be as steady as might otherwise be required since the y- and z-positions of the top and bottom of the source region are defined by a fixed member (the aperture 276) which is not subject to vibration and other inaccuracies caused by the movement.

On the detector side of working space 252, the top and bottom edges of detector regions 254 and 256 are straight enough to act as their own horizontal apertures. This obviates any need for a shield like source shield 272 with a horizontal aperture, although one may be included if desired. However, the use of shield 260 with vertical slit 264 performs the same function as shield 282 with its vertical slit 286. The detectors remain fixed while the carriage assembly 210 moves, and while the slit 264 moves along the length of detector regions 254 and 256. Since the slit 264 extends both above and below the top and bottom edges of detector regions 254 and 256, the y- and z-positions of the top and bottom edges of the effective detection regions are not subject to the vibration and unsteady movement of the carriage assembly 210.

The resolution of the apparatus 200 in the x-dimension depends on the fineness of the scale markings in linear encoder 222 and also on the width of the slits 286 and 264. For example, consider a series of points taken along a side of a PLCC, starting from the body edge on the left side of a lead and continuing across the lead to the body edge on the right side of the lead. Consider also the thickness of the "knife" of light defined by the slits 264 and 286. When the knife edge passes through only points on the body edge, the position of those points will determine the light intensities in the detection regions 254 and 256 as seen through slit 264. Since these points lie generally on a straight line, substantially parallel to the x-axis, the intensity values obtained will be an accurate representation of the y-z positions of all the edge points which are within the knife edge. The same is true when all the edge points within the knife edge form part of the lead tip. When the lead side is within the knife edge, however, some of the points determining the penumbra intensity are on the lead tip, some on the body edge and possibly some on the lead side. The intensity value received will indicate an apparent edge position somewhere between the lead tip and body edge positions.

The technique of using multiple fixed and moving apertures is extendable to permit many variations of the above-described apparatus. For example, instead of using long, stationary detectors and a moveable vertical slit, it would be possible to use moving vertical-slit-shaped detectors and a fixed horizontal aperture similar to the horizontal aperture 276 in shield 274 on the source side of the working space 252. As long as the movement vertical-slit-shaped detectors extend both above and below the top and bottom boundaries of the fixed horizontal aperture, any vibration or up-and-down motion of the detectors during scanning would be inconsequential. As another example, it may be desirable for one reason or another to use detector regions 254 and 256 whose top and bottom boundaries are not straight lines. This is feasible if the slit 264 is long enough such that it continues to extend both above and below the top and bottom boundaries of the detector regions 254 and 256 at each x-position at which measurements will be taken, and if the location and dimensions of the detection regions are known for each such x-position.

The apparatus 200 as described above is capable of other variations as well. For example, the electronics on the printed circuit board in detector/amplifier assembly 250 may be simplified by eliminating one of the two signal paths and timesharing the other. In such a situation readings from the two detectors could be taken successively and not simultaneously, but if the x position of the y-z plane has not moved more than a small amount between readings, the two readings may be treated as if taken simultaneously. Other ways may be found to pool hardware, such as by using only a single detector and moving its effective detection region between the top and bottom positions for successive intensity readings. The latter technique would, of course, require that the motion of the detection region be smooth.

One important consideration is that the working space 252 should be as dark as possible. Any stray light which reaches the detector regions from outside the apparatus, or by reflection from inside the apparatus, will degrade the results. One way to ensure darkness is by enclosing the entire apparatus in light-tight surroundings and coating all possible interior surfaces with a light absorbing paint such as ECP-2200 solar absorber coating manufactured by 3M, South Egan, Minn. It may also be desirable to filter the spectrum of light which reaches the detectors such that only light with an appropriate wavelength is detected.

Head Characterization Procedure

In the y and z dimensions, the resolution of the system is limited by the resolution of the analog to digital converters 326 and 330 shown in FIG. 11, and by the geometry of the system. In the system as described above, the detector plane is almost three inches from the source plane, but the two detectors are spaced in the z dimension by only approximately 5 mils. This results in intersecting hyperbolae 120 and 122 (see FIG. 2) which are extremely long in the y dimension and narrow in the z-dimension. Without the use of any correction algorithms, the system nevertheless has an excellent resolution in the z direction of approximately 70 microinches and a resolution in the y direction of about 0.010". These resolutions may be altered by changing the geometry of the device. For example, the detectors may be spread farther apart, which would improve both the y and z resolution, or the source aperture moved closer to the detectors, which would improve the y-resolution at the expense of the z-resolution. Y-resolution may also be improved by incorporating an additional source and pair of detectors, having an optical centerline oriented with respect to the platform 310 (see FIG. 5) at an angle different from that at which the optical centerline of the original set is oriented. If the additional set does not interfere with the original set, then the two sets may be situated with their optical centerline located in the same sensing plane. Otherwise, the two optional centerlines may be spread apart in the x-dimension and the readings taken by the two sets coordinated later by computer. Note that changing the geometry of the system will also change the effective measurement zone.

The accuracy of the system is limited by the degree to which the source filament approximates a straight line, the uniformity of the light source and the linearity of detector response, and also by the tolerance to which the apparatus is manufactured. As explained in the Appendix, the mathematics for the above apparatus requires that certain constants regarding the scan head be known in advance and used in the equations. These are: the y-distance between the source aperture 276 and the surface of detectors 254 and 256 ("h"); half the z-dimension height of source aperture 276 ("a"); z-positions of the detector surfaces 254 and 256 ($z_{tl}$, $z_{bl}$, $z_{t2}$ and $z_{b2}$); the intensity received by each detector when an edge entirely blocks the line-of-sight between the source and detectors ($I_{closed\ 1}$ and $I_{closed\ 2}$) and the full intensity received by each detector when no edge is present ($I_{open1}$ and $I_{open2}$). (See the Appendix eqs. 7-8) In practice it is very difficult to manufacture a head such that these values are within the necessary tolerance. Alternatively, if the equipment is manufactured to less restrictive tolerances, it is very difficult to measure these values directly for use in the equations. It is also likely that the values are different for different values of x. The values for $I_{open}$ may also change as a function of time.

In another aspect of the invention, a calibration procedure may be used on the apparatus and correction values obtained for use in improving the accuracy of the y and z positions determined for a given pair of intensity values received. Without any change in geometry, the calibration procedure improves the y-resolution of the system to approximately 0.5 mils and improves the z-resolution to approximately 10 microinches. The calibration procedure involves two different techniques which may be used either separately or together. The first technique attempts to detemine an effective set of the geometric parameters by trying various permutations of deviations from nominal values of said parameters until a set of parameters is found which minimize some error function. The second technique involves experimentally moving a calibration edge to various known positions in the measurement region and storing the ratios of the intensity values which should be obtained for each such position, according to the mathematics, to the intensities actually received. These ratios are then used as correction factors when the apparatus is in use.

Figure 12:
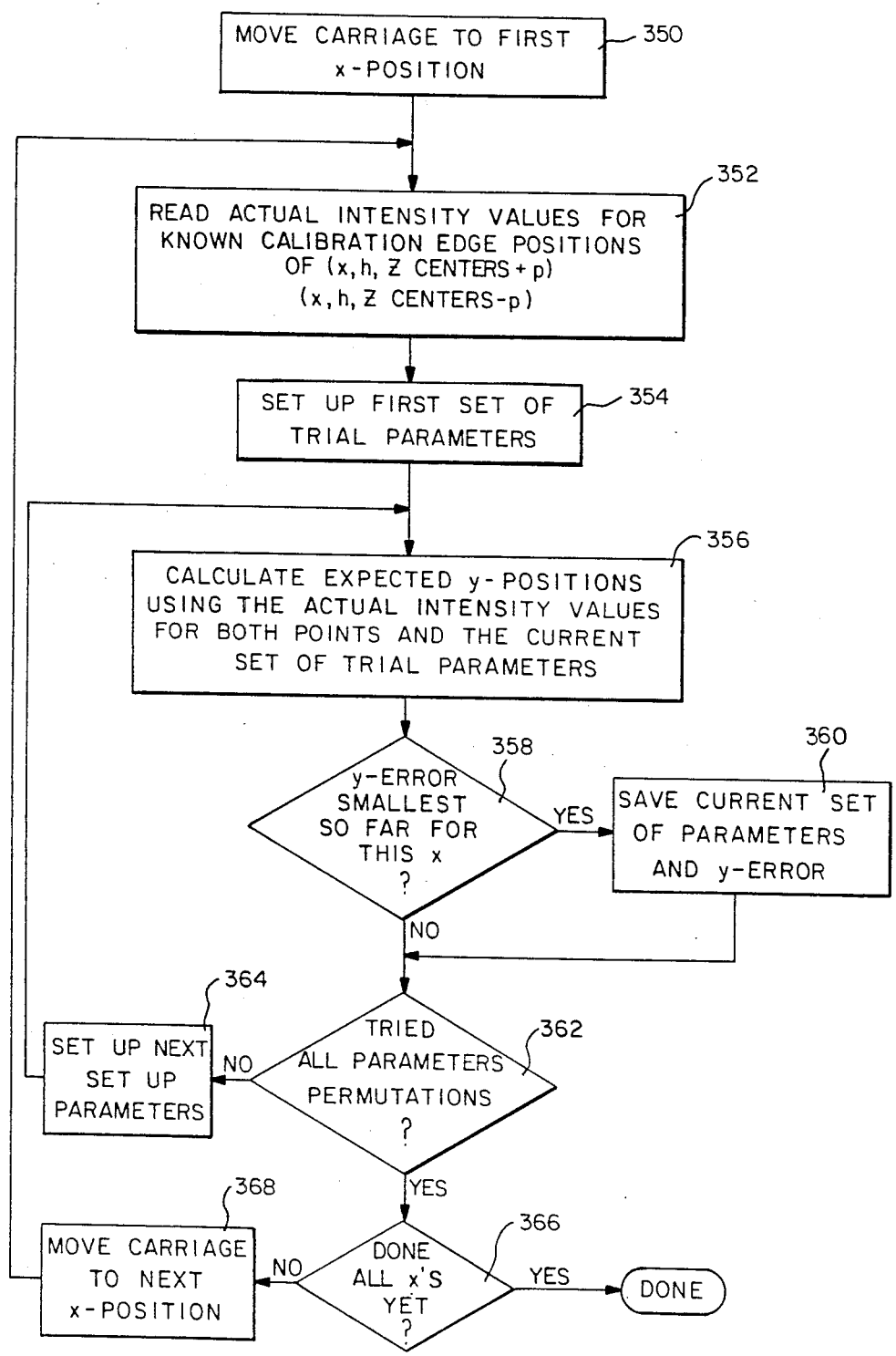
FIG. 12 is a flow chart showing how the first calibration technique may be implemented.

Referring to FIG. 12, there is shown a flowchart describing the first calibration technique. The basic parametric variation loop is performed for every x-position of the optical center line 300, but it will be understood that it may instead be performed at known intervals along the x-axis. In the latter case, the parameters determined by the technique may be interpolated for x-positions between those at which the parametric variation routine was performed.

Beginning at a step 350, the carriage is moved such that the optical center line 300 is at a starting x-position. In a step 352, the actual intensity values received at the two detectors are read for each of two known y- and z-positions of a calibration edge. The calibration edge may be disposed in such positions by a high precision laboratory stage, such as one manufactured by Burleigh, Fishers, N.Y. The two positions are chosen to be at the source aperture 276 and a distance p, respectively, above and below the optical center line 300. P is chosen to be small compared to half the aperture height a. At a step 354, a first set of trial parameters are set up in memory. Any or all of the above geometric parameters may be permuted with this routine. In step 356, the mathematically derived formulas are used to calculate the two edge positions which are indicated by the intensity values received at the detectors. Since it is known that the two calibration edge positions are in actuality at identical y-positions, the calculated (expected) y-positions of the two points are subtracted from each other to reach an error value. If this error is the smallest error detected so far for various sets of trial parameters at this x-position (step 358) then the current set of trial parameters are saved, together with the y-error obtained (step 360). If all possible parameter permutations have not yet been tried (step 362), then the next set of parameters are set up in memory (step 364) and control is returned to step 356. Otherwise, if not all desired x-positions have yet been characterized with this technique (step 366), the carriage is moved such that the optical center line 300 is now at the next x-position to be characterized (step 368) and control is returned to step 352.

It can be seen that the error testing step 358 need not be exactly that described above. It may instead be, for example, a comparison of the y and/or z-positions of the expected edge location with only a single known edge position. The edge position used, additionally, may be located anywhere in the active zone. As another example, when two calibration edge positions are used, located at distances +p above and below the y-axis, instead of comparing the two calculated y-values for equality, one of the calculated z-values may be subtracted from the other and the result compared to 2p. Numerous other possibilities will be apparent.

It can further be seen that a large number of permutations may be required for each x-position. It has been found advantageous to manufacture the head as close to tolerance as possible, and then use only about five permutations for each parameter: a nominal value and two values above and two below.

This first calibration technique relies on a significantly underrestrained system. Several unknowns are permuted, but only one error output is tested for the optimum permutation. The technique therefore provides only some improvement in the accuracy of the apparatus. The technique also helps to reveal the behavior of the apparatus as different parameters are varied.

Figure 13:
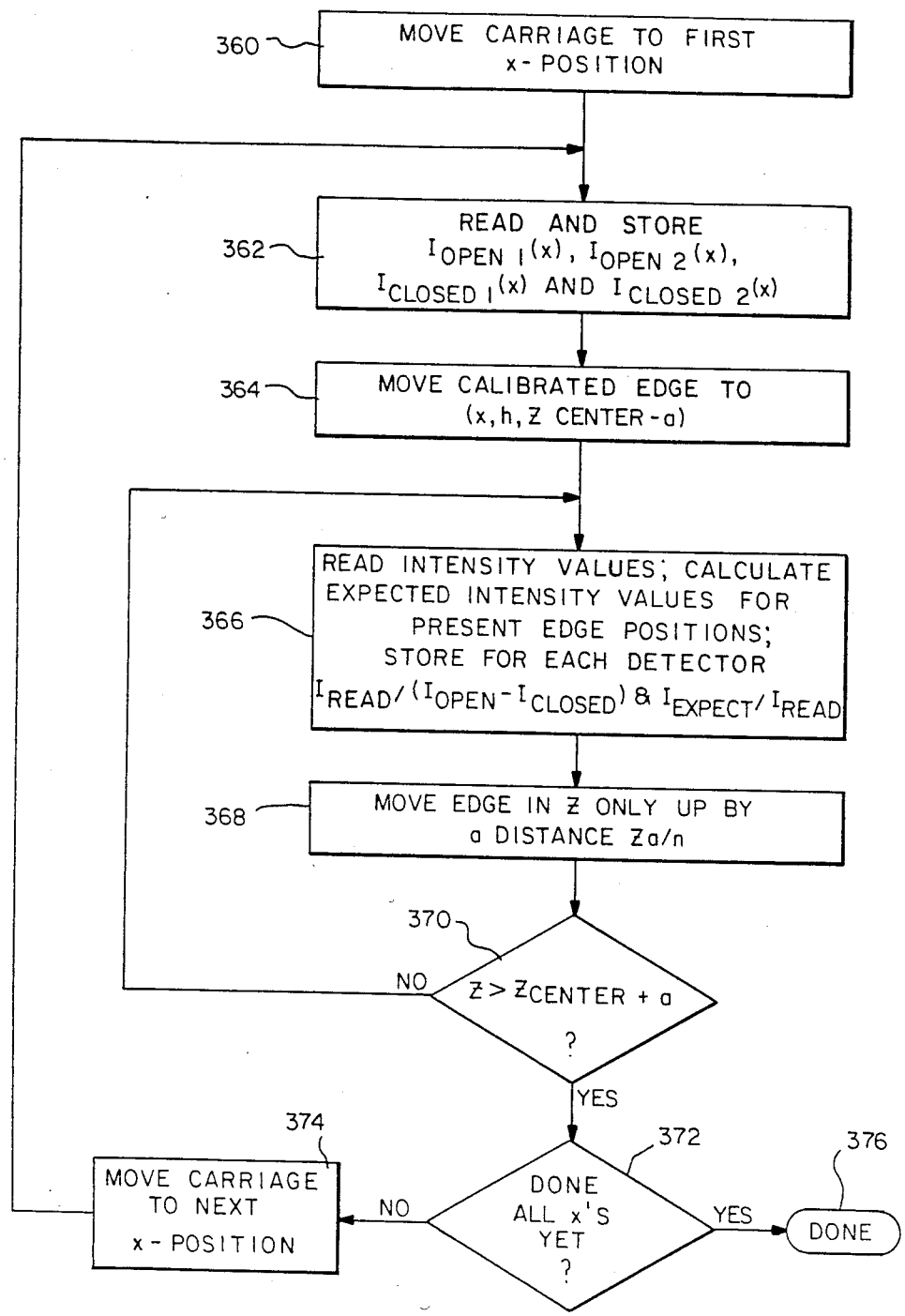
FIG. 13 is a flow chart showing how the second calibration technique may be implemented.

The second technique will be described with respect to FIG. 13. This technique may be performed instead of or in conjunction with the first technique, and may follow or precede it. Beginning with step 360, the carriage is moved such that the optical center line 300 is at a first x-position. Like the first technique, the calibration may be performed at every possible x-position at which measurements will be taken or it may be performed at intervals, the results being interpolated to provide correction values for intermediate x-positions. In a step 362, the maximum intensity values $I_{open1}$ and $I_{open2}$ and minimum intensity value $I_{closed1}$ and $I_{closed2}$ are read for the two detectors with the calibration edge outside the measurement area. In a step 364, the calibration edge is moved to the lowest z-position in front of the source aperture, Zcenter−a, and coplanar with the aperture plane. The value of "a" used here may be the nominal value or, if the first calibration technique has alredy been performed, the effective value obtained thereby. The actual value of "a" has been found to vary by as much as 250 microinches along the length of the aperture 276. Surprisingly, it has been found that this calibration technique works successfully for a wide range of values chosen for "a" at this point, as long as they are smaller than and close to the actual "a" at this x-position. Thus, it has been found advantageous to choose a value of "a" for the purposes of this technique only, which is just smaller than the smallest actual "a" in the length of the aperture 276.

In a step 366, the actual intensity values received at the two detectors for the present position of the edge are read. The calculation formula derived for this geometry is then operated in inverse, so as to calculate expected values of I for each of the two detectors given the known present values of y and z. An array is created for the known present x-position of optical center line 300 and the ratios $I_{read}/(I_{open}-I_{closed})$ and $I_{expected}/I_{read}$ are stored for each of the two detectors. The edge position at which such intensity values were taken is not stored. The array therefore has two pairs of two columns each, each pair consisting of an index value, which is the ratio of the intensity read at detector i to full intensity, and the second being the correction multiplier to be applied when that index value of intensities is read. At a step 368, the calibration edge is moved in the z direction only by a distance of 2a/n. This step determines the z-increment at which correction values will be obtained and stored. A value of n=100 has been found advantageous.

If the calibration edge has not yet been moved up above z=Zcenter+a (step 370), then control is returned to step 366. Otherwise, if all x positions have not yet been characterized by this technique (step 372), then the carriage is moved to the next x-position (step 374) and control is returned to step 362. If all x-positions have been calibrated, the routine is exited (step 376).

The second characterization technique therefore yields for each value of x, and for each of the two detectors, a maximum intensity value $I_{open}$, a minimum intensity value $I_{closed}$ and an array of 100 correction values. Each correction value is paired with an index value indicating the ratio to full intensity of the intensity actually read when the corresponding correction value was obtained. The correction values have found to be typically no more than 1% above or below unity. When the apparatus 200 is in field use, the intensity values reaching each detector are first read. Each is then divided by the difference between the stored minimum and maximum intensity values $(I_{open}-I_{closed})$ for that x-position to calculate a pointer value. The pointer value is then compared to the index values in the array for that detector and a correction value selected. If the pointer value is between index values, the array may be linearly or otherwise interpolated and an appropriate correction value calculated. If the x-position of the edge is between the x-positions at which array values were originally generated, these array values may be interpolated in the x-dimension as well. Additionally, depending on the short term and long term stability of the light source 288, new values of $I_{open}$ may be taken and stored periodically when the apparatus 200 is in the field. This may be done after fixed intervals of time, or possibly on every return stroke of the carriage 210. As another alternative, a separate calibration detector may be incorporated which is never blocked by a workpiece edge, and which forces a recalibration of $I_{open}$ values whenever the intensity of the source varies by more than a desired tolerance. If field recalibration of the $I_{open}$ values is performed by one method or another, it has been found that the source may vary in intensity by up to approximately 10% without seriously degrading the effectiveness of this second head characterization technique.

Many variations on this second technique will be apparent. For example, since the arrays are indexed only in terms of intensity ratios, and not in terms of any position of the calibration edge, the calibration edge need not remain only along the source plane during calibration. It may be moved to any place in the measurement region. It may be moved to selected positions based not on z-increment, but on index ratio increments. In the latter case the edge would be moved until the desired index ratio increment is reached, and the true resulting y- and z-positions of the edge read from the laboratory stage for use in the equations. This would result in equally spaced index values, from 0.01 through 0.99 (depending on n). This could eliminate any need to store the index values in the storage arrays, since the location of each correction value in the array may be divided by n to calculate the index values. In other variations, the index value stored need not be as described above. Instead, absolute intensities may be stored. As yet another example, the correction values may be stored in a form other than simple ratios between the expected and actually read values. Depending on the formulas used in the field, it may be desirable to store correction values, for example, in a form like $I_{expected}-I_{read}$. Many other variations will be apparent.

Either or both of the above two calibration techniques may be used, and in either order. Additional accuracy may be obtained by performing the two techniques iteratively. That is, after the intensity correction factor technique and the parametric variation routine are each performed once, the parameters determined by the parametric variation routine may be inserted into the equations and the intensity correction factor procedure performed again to generate new correction factors. The parametric variation routine may then be performed again, but this time the best parameter set that if finds would be retained only if it results in better resolution than the previous set.

As mentioned above, it could be very expensive to build the system initially with the precision required for the level of accuracy desired. It is therefore preferable to build the system to be as stable as possible and then calibrate it according to the above techniques. The calibration data may be stored in a ROM or PROM and shipped with the system. Moreover, additional calibration data may be obtained for certain spare parts or subassemblies (such as replacement lamps) to be shipped with the system, the additional calibration data also being stored in the ROM. A user could indicate to the inspection computer when a replacement part has been installed, after which the computer would begin applying the appropriate additional calibration data.

Four-Sided Measurements

The apparatus of FIGS. 5–11 may be used for obtaining an edge profile of different sides of a workpiece by scanning the workpiece several times and rotating the workpiece by a desired angle between successive scans. Another way to accomplish this is to place several scan heads in sequence along a track, with rotators located between the scan positions. The latter method has the advantage of permitting pipelined operation, whereby, for four-sided measurements, eight different workpieces may be operated on simultaneously (four in scan positions and four in rotate positions).

In the apparatus of FIGS. 5–11, the carriage plate 212 is already wide enough to permit mounting thereunder a second optic projector assembly like 280, a second fixed source shield like 272, a second moving detector shield like 260 and a second detector/amplifier assembly like 250. The entire apparatus 200 may then be repeated as a unit to provide two more scanning stations. The same servo motor 230 may be coupled to the carriage assembly in the second unit such that all four scanning stations scan simultaneously. The electronic circuits shown in FIG. 11 may be shared and multiplexed to reduce cost without losing accuracy in the x-dimension, since the x-positions at which readings are taken are meaningful only with respect to other readings taken on the same side of the workpiece; there is no need for the i'th point read on one side to bear any relationship to the i'th point read on any other of the four sides.

A problem arises, however, when it is desired that the system operate on different sizes of workpieces without requiring physical reconfigurations or adjustments. In prior art transport apparatus, the workpiece was typically moved along a track which had at least one guidewall alongside it. When the workpiece was to be rotated by, for example, 90°, it was moved along the guidewall onto a rotation table such that the center of the workpiece was over the rotation axis of the table. This ensured that the workpiece, assuming it was square, would be in exactly the same position after rotation as before. That is, if a first side of the workpiece is against the guidewall before being moved onto the table, the second side of the workpiece, adjacent to the first side, would now be against the guidewall when the workpiece is moved off the table after rotation.

However, if a larger workpiece is used, movement of the workpiece onto the rotation table with the first side of the workpiece against the guidewall will no longer center it over the rotation axis. When the table is rotated the second side will no longer be in-line with the guidewall. Prior art transport apparatus typically would remedy this problem by requiring either the rotation table or the guidewall to be moved when a new workpiece size is to be used, such that the normal movement of the part will once again place it over the rotation axis. It is desirable to avoid such physical adjustments.

Figure 14:
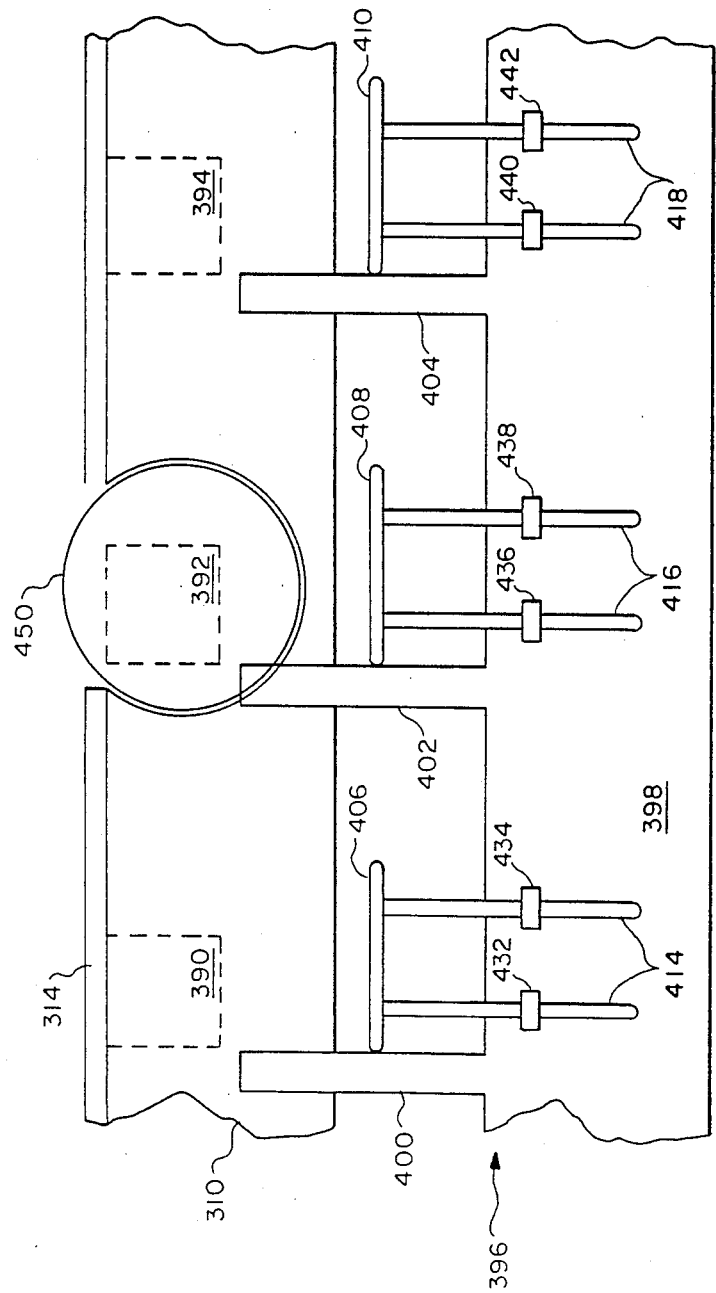
FIG. 14 shows transport apparatus which may be used according to the invention, including a novel rotation table.

In another aspect of the invention, physical adjustments are avoided by moving the part along the track with reference only to two sides of the part: a first side which is against the guidewall and a second side adjacent to the first side. For example, if the second reference side is the side trailing the first side, the part may be pushed along the guidewall by a walking beam pushing the part from behind. FIG. 14 shows relevant portions of the transport apparatus which may be used to accomplish this. It shows a portion of the platform 310 which may also be seen in side view in FIG. 5. The platform 310 extends the length of the four scanning positions and connects on either end to input and output tracks (not shown). The guidewall 314 is also shown. Three square workpieces 390, 392 and 394, which may be PLCC integrated circuit packages, are shown in three rest positions on the platform 310. Workpiece 390 is at a first scan location, workpiece 392 is in a rotate position ready to be rotated, and workpiece 394 is in a second scan position. The workpieces are moved along the platform 310 in a direction parallel to and against the guidewall 314, by a walking beam 396. The walking beam 396 comprises a walking beam plate 398 which extends the length of the platform 310, and from the side of which protrudes a series of eight arms spaced at regular intervals corresponding to the distance between stations on the platform 310. Shown in FIG. 14 are arms 400, 402 and 404. Also extending from the same edge of walking beam plate 398 as the arms 400, 402 and 404 are registration apparatus for each of the arms. Each such registration apparatus comprises a respective registration plate 406, 408 or 410 disposed parallel to the guidewall 314, extending from the side of walking beam plate 398 via plunger pairs 412, 414 and 416, which plunger pairs are held in place by guides 432, 434, 436, 438, 440, and 442, respectively for the arms 400, 402 and 404. Means (not shown) are provided which urge the registration plates 406, 408 and 410 outward toward the guidewall 314 when desired. This is merely a figurative example of registration apparatus, and it will be understood that any registration apparatus may be used.

In operation, with the workpiece 390, 392 and 394 at rest, the walking beam 396 is pulled away from the workpieces 390, 392 and 394 so as not to interfere with their manipulation. This is the position shown in FIG. 14. When it is desired to move the workpieces forward to the next position, the walking beam 396 is moved toward the guidewall 314 until the arms 400, 402 and 404 are very close thereto. The walking beam 396 then moves forward such that the arms 400, 402 and 404 push their respective workpieces 390, 392 and 394 forward into the next successive position. The registration plates 406, 408 and 410 are then extended to press respective workpieces 390, 392 and 394 against guidewall 314. The guidewall 314 is broken at the rotation station, and apparatus (not shown) is provided to prevent registration plates 406 and 408 from pushing the workpiece located at that position through the gap. The walking beam 396 then pulls away from the guidewall 314 and returns to the position shown in FIG. 14. It can be seen that the walking beam 396 effectively moves the workpieces forward, from one position to the next, by reference only to the side of the workpiece which is against the guidewall 314, and the trailing-adjacent side which is against the arms 400, 402 or 404. Thus the workpieces are moved into the rotation station with reference only to those two sides of the workpiece.

The rotation station includes a rotation table 450, shown in more detail in FIGS. 15 and 16. The rotation table has a flat platform surface 452 through which are bored five suction holes 454, 456, 458, 460 and 462. Suction hole 462 is located on the rotation axis, and suction holes 454, 456, 458 and 460 are located on diagonals of the table 450 passing through the rotation axis. The location chosen for the four latter suction holes will be explained below. Referring to FIG. 16, it can be seen that each of these suction holes are larger at the top than at the bottom. Essentially they are wells 462 which depend into the table 450 by a distance less than the thickness of the table 450. Extremely narrow orifices 464 are drilled in the bottom of the wells, thereby permitting air pressure communication to the undersurface 466 of the table 450. The wells 462 have approximately a 3/16 inch diameter at the surface 452 and depend approximately 15 mils deep. The orifices 464 are only approximately 16 mils in diameter. Attached to the undersurface 466 of table 450 is a commercially available rotary union vacuum connector 468 having a shaft 470 coupled to a motor (not shown) and also having a vacuum inlet 472 for connecting a vacuum pump to the suction holes 454, 456, 458, 460 and 462.

Figure 17A:
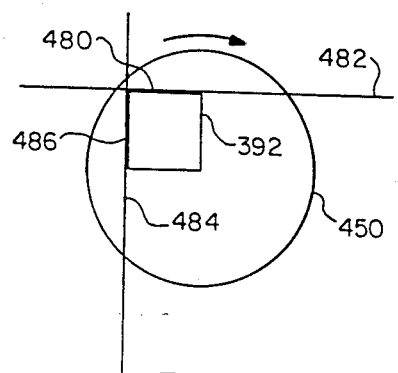
FIGS. 17a, 17b, 18a and 18b show diagrammatical plan views of the rotation table of FIG. 14 useful for explaining the operation of such rotation table.
Figure 17B:
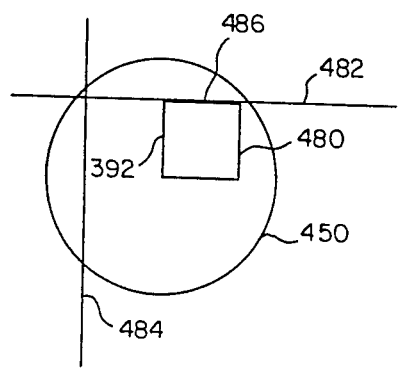
Figure 18A:
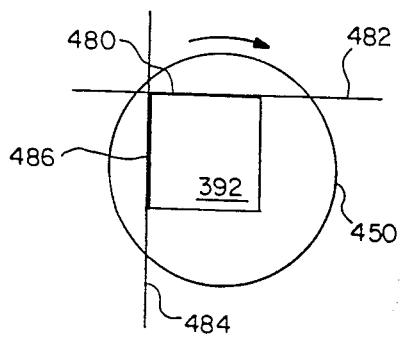
Figure 18B:
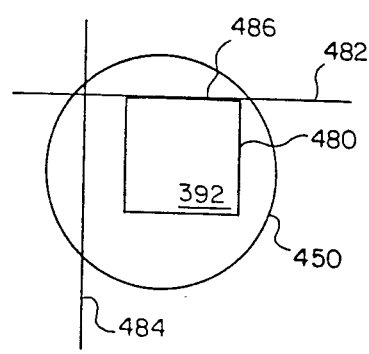

In operation, the walking beam 396 moves the workpiece 392 onto the table 450 such that the first side 480 of the workpiece 392 is along a first line 482, the first line being collinear with the guidewall 314. (See FIGS. 17a and 18a.) The arm 402 which pushed the workpiece 392 onto the table 450 stops when it is collinear with a second line 484, thereby ensuring that the second side 486 of the workpiece 392, trailing-adjacent to the first side 480, is on the second line 484. After the arm 402 pulls away from the workpiece to provide sufficient clearance, the table 450 is rotated, clockwise as shown in FIGS. 17a and 18a, by an angle of 90°. At this point the workpiece 392 is now located in the position shown in FIGS. 17b and 18b. As long as the second line 484 was the same distance from the rotation axis as the first line 482, the second side 486 of workpiece 392 will end up collinear with the guidewall 314. It can further be seen that this will be the case regardless of the size of workpiece 392. One size is shown in FIGS. 17a and 17b while a larger size is shown in FIGS. 18a and 18b.

It is greatly advantageous to provide a holding means for holding the workpiece 392 on the rotation table surface 452 during rotation. This is the purpose of suction holes 454, 456, 458, 460 and 462. The wells 462 provide a large holding force since they are wide at their tops, but in case the workpiece 392 is not large enough to cover one of the suction holes, the orifices 464 are extremely narrow to prevent excessive air leakage.

Since the size of the workpiece 392 to be rotated is not known, it is advantageous to provide the strongest possible holding force with the fewest possible holes. This is satisfied by placing all the holes on the diagonals as shown in FIG. 15. If a small workpiece is being rotated, it will cover only one of the corner holes 454, 456, 458 or 460. A somewhat larger workpiece will also cover the hole in the center of the rotation table 450, 462. A still larger workpiece 392 will cover all five holes. (It should be noted that there is no limit to the size of workpiece 392 which may be rotated by this method, as long as sufficient holding force is provided on the rotation table 450, and as long as the guidewall 314 and other apparatus in the system do not interfere.) If there is a known minimum size for workpieces to be rotated, it is advantageous to place the corner holes 454, 456, 458 and 460 such that they will be located in the exact center of the smallest expected workpiece.

This technique is capable of many modifications. For example, the output portion of guidewall 314 need not be collinear with the input portion, but instead it may go off at a different angle. In this case the table 450 need only rotate by the angle necessary to leave the second side 486 of the workpiece 392 collinear with the output portion of guidewall 314. As another example, the output portion of guidewall 314 may be parallel to the input portion of guidewall 314 but not collinear therewith. In this case the second line 484 need only be positioned the same distance from the rotation axis as is the line on which the output portion of guidewall 314 is located. Also, although the appropriate rotation direction for the rotation table shown in FIG. 14 is clockwise, it will be apparent that the appropriate rotation direction would be counterclockwise if the system flow was right-to-left instead of left-to-right. Counterclockwise would be the appropriate direction also if the transport apparatus was modified such that the second referenced side of the workpiece 392 becomes the side *leading*-adjacent to the first side 480 instead of the side *trailing*-adjacent to the first side 480. It may also be desirable to perform an extra counterclockwise rotation for the final rotation in the system, in order to present the workpiece with a proper orientation at the system output. Numerous other modifications will be apparent.

Unless the workpiece happens to be square and of the exact size which causes it to be centered over the rotation axis of the table 450, a translation of the workpiece will result. Thus where, as here, the second side is trailing-adjacent to the first side, a workpiece which is smaller than the size necessary to place its center over the rotation axis will be translated forward as a result of rotation. In certain situations the workpiece will be translated backward. These translations should be accommodated by the transport means.

System Flow

Once edge profiles are obtained for the four sides of a workpiece, such as a PLCC, various inspection procedures may be performed on the stored data to determine whether the workpiece was within tolerance. The data may first be reduced by eliminating data points from groups of data points which have not changed more than a threshold amount after a predetermined number of x-positions. The positions of the lead tip centers are then extracted from the data by referring to the intensity values read by one of the detectors for sequential x-positions. These values decrease as a lead enters the knife edge of the y-z sensing plane, and increase as the lead leaves the sensing plane. Thus, the system begins storing y-z position information when this intensity value falls below a predetermined threshold (indicating that the lead is entering the sensing plane), and stops when the intensity value again rises above that threshold (indicating that the lead is leaving the sensing plane). The lead tip center is the measurement at which the intensity value read by the detector was lowest, and the lead width is roughly the number of stored values multiplied by the x step size. Lead width may also be determined by referring to the inflection points of the measured x-z edge profile. Yet another way to determine lead width is by noting the x-positions at which the y-values of points on the edge profile jump from those appropriate for a *body* edge point to those appropriate for a *lead* edge point and back.

Body edge measurements, from the spaces between the leads, are also extracted at this time. Only one body edge reading is kept between each pair of leads and none are kept for the body corners.

Certain tests may now be performed on the data. For example, sweep errors may now be determined by examining the x-positions of the lead tip centers. Standoff height may also be tested by comparing the z-positions of the lead tip centers to the z-position of the body edge on both sides of each lead. Spread may be tested by comparing the y-positions of the lead tip centers with those of other leads on the same side of the workpiece. Certain other tests, such as tweezing coplanarity and coplanarity, should be performed only after a step, described below, for interrelating the measurements obtained for the four different sides of the workpiece.

Interrelating the Four-Sided Measurements

In any system which makes measurements of the four sides of a workpiece, either simultaneously or sequentially, if tests are to be performed on the resulting data which require comparing edge positions on one side of the workpiece to edge positions on another side of the workpiece, some means must be provided for ensuring that such measurements are meaningful when related to each other. In prior art systems, such as the imaging system described above, this was accomplished through the use of elaborate calibration techniques which required physical movement of the cameras or lens systems until alignment was achieved. The coordinate systems of the various cameras were thereby made mutually orthogonal and their readings were inherently interrelated.

In another aspect of the present invention, such calibration may be avoided by assuming that the bottom of the package body is an ideal flat surface with a rectangular boundary, then mathematically altering the readings taken for the four separate sides of the workpiece until closure is achieved. That is, a line drawn through the body edge readings for each of the four sides of the workpiece must intersect at their respective corners, and the body edges must all be coplanar. These criteria will be absent when, for example, the optical center lines of the four different heads are not quite in the same relative position or angle with respect to the platform 310 and guidewall 314. Another cause of error might be dirt or other foreign objects lodged under the workpiece in one or more of the scanning positions. When the body edge readings fail the criteria, correction may be made by either translating the edge position measurements in z until they do meet, or rotating the measurements about an axis parallel to the y-axis, or both. In the latter case, the angle of rotation would likely be so small as to render alteration of the x-position of rotated points unnecessary. It is advantageous to choose adjustments which minimize the number of calculations required. An important feature of this technique is that adjustments are made to the measured values of the lead tip centers by reference not to the lead tip centers themselves, but to the body edge readings. Any transformation made to the body edge measurements in order to achieve coplanarity of body edges or closure at the body edge corners is made in corresponding amount to the lead tip center measurements.

Tweezing Coplanarity

Once the measurements taken for the four sides of the workpieces are adjusted as above, tests for tweezing coplanarity and coplanarity of lead tips may be performed. The tweezing coplanarity test is performed by a novel technique which does not involve direct measurement of the parameter. First, the tweezing coplanarity definition requires determination of the line which passes through the two lead shoulders for a given side which protrude by the greatest amount from the body. However, with the optical center line 300 deviated from the horizontal by only 10°, data on the protrusion of the lead shoulders from the body is not directly available since they are hidden by the body. However, since the workpiece was registered against the guidewall 314 when the measurements were taken, the guidewall 314 represents this line. Referring to FIG. 5, it can be seen that the guidewall 314 contacts the leads at their shoulders and not higher. Thus if a line drawn along these outermost lead shoulders deviates by more than 6 mils from a line parallel to the datum line, then so must a line drawn through the body edge points, the positions of which have been measured between the leads. Similarly, though the datum line is defined as the line passing between the centers of the two center leads on the two sides of the package adjacent the side being tested, the centers to be determined at the lead shoulders, an equally good datum line can be taken from the centers of the lead tips. This is because the package has already passed the sweep test, indicating that a line through the lead tip centers will be almost exactly parallel to a line through the lead shoulder centers.

Once the above observations are made, and assuming the package body sides are each orthgonal to their respective adjacent body package sides, the tweezing coplanarity test reduces to the following test:

Where the package is of a type including a body having a base surface, a first side surface, a second side surface adjacent to the first side surface, a third side surface adjacent to the second side surface, and a fourth side surface joining the third and first side surfaces, the package further including first, second, third and fourth body edges at meetings between the base surface and, respectively, the first, second, third and fourth side surfaces, the package further including a first plurality of leads extending from the first side surface, a second plurality of leads extending from the second side surface, a third plurality of leads extending from the third side surface, and a fourth plurality of leads extending from the fourth side surface, each lead extending outward from the body in a direction nominally parallel to the base surface for a respective protrusion distance, then bending at a respective lead shoulder to pass through a base plane containing the base surface in a direction nominally perpendicular to the base plane, a first reference line being defined as the line passing through the lead shoulders of the two leads extending from the first side surface, which two leads have the largest protrusion distances of all the leads extending from the first side surface, a second reference line being defined as the line passing through the lead shoulders of the two leads extending from the second side surface, which two leads have the largest protrusion distances of all the leads extending from the second side surface, a third reference line being defined as the line passing through the lead shoulders of the two leads extending from the third side surface, which two leads have the largest protrusion distances of all the leads extending from the third side surface, a fourth reference line being defined as the line passing through the lead shoulders of the two leads extending from the fourth side surface, which two leads have the largest protrusion distances of all the leads extending from the fourth side surface, a failure is indicated:

(1) if the sum of the distance between the first reference line and the first body edge and the distance between the third reference line and the third body edge differs from a first constant by more than a tweezing coplanarity tolerance, both distances being taken along a projection into the base plane of any perpendicular to the first reference line, which projection intersects both the first body edge and the third body edge; or (2) if the sum of the distance between the second reference line and the second body edge and the distance between the fourth reference line and the fourth body edge differs from a second constant by more than the tweezing coplanarity tolerance, both distances being taken along a projection into the base plane of any perpendicular to the second reference line, which projection intersects both the second body edge and the fourth body edge.

Coplanarity Test

The coplanarity test is divisible into two major portions: finding the seating plane and determining whether any lead tip is more than the coplanarity tolerance from the seating plane. The first part of the procedure can be mathematically described as follows. A point $p_i=(x_i,y_i,z_i)$ give the location of the i'th lead tip center in space. The set of lead tip centers is defined as all the $p_i$ on the IC package under inspection. The seating plane is then a plane PL defined by three points $p_i$ such that all the other points in the set lie either on PL or on the same side of PL.

In another aspect of the invention, the seating plane here is determined by an iterative method which in effect emulates the sequence of events which occur when an IC package is physically lowered, leads down, onto a flat surface. The technique is much better than techniques which rely on point transformations, since it provides lower numerical error and faster computation speed. The procedure has other novel aspects as well, which will become apparent as it is described.

Figure 19:
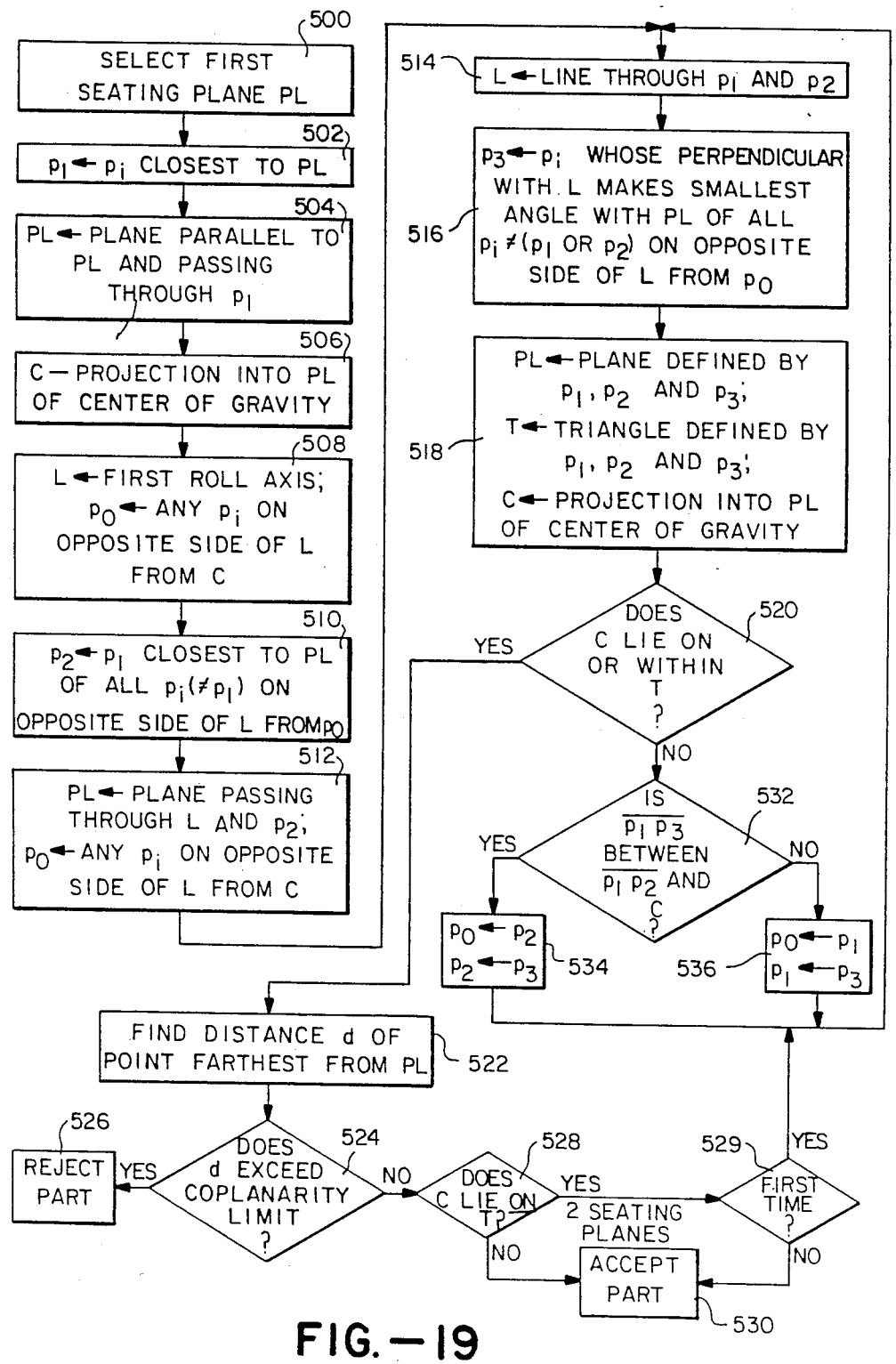
FIG. 19 is a flow chart showing how the coplanarity test may be implemented.

Referring to FIG. 19, the process of determining the seating plane begins at step 500 with the selection of an initial seating plane PL. At a step 502, the lead tip $p_1$ is chosen which is closest to PL. In step 504, PL is replaced by the plane parallel to the previous PL and passing through $p_1$. Since the choice of an initial seating plane has little bearing on the efficiency of the procedure, steps 500, 502 and 504 may be replaced by the single step of letting PL equal the plane parallel to $z=0$ and passing through $p_1$, where $p_1$ is the $p_i$ which has the smallest $z_i$.

A first roll axis is determined by calculating a projection into PL of the center of gravity of the package (step 506), and then choosing the line L lying in PL, passing through $p_1$ and perpendicular to a line drawn through $p_1$ and the projection C of the center of gravity into PL. At this point in the procedure, it is already known that none of the lead tips on the opposite side of L from C will touch the final seating plane. For reference purposes, $p_0$ is given the value of any $p_i$ on the opposite of L from C (step 508). If such a $p_i$ does not exist, then any point in PL on the opposite side of C may be chosen. The next lead tip to touch PL, $p_2$, is then chosen. If a perpendicular is drawn from L to each $p_i$ on the same side of L as C, then $p_2$ is that $p_i$ whose corresponding line makes the smallest angle with PL (step 510). In step 512, PL is revised to represent the second seating plane, which is the plane passing through the first roll axis L and the second lead tip $p_2$ to touch a tentative seating plane. $p_0$ is now updated to represent any $p_i$ on the opposite side of L from the projection into the new PL of the center of gravity, except those $p_i$ already excluded as mentioned above.

In a step 514, a second roll axis L is determined as the line passing through $p_1$ at $p_2$. $p_3$ is then chosen. If a perpendicular is drawn from L to each of the remaining possible $p_i$, then $p_3$ is that $p_i$ whose corresponding perpendicular makes the smallest angle with PL (step 516). In step 518, PL is revised to represent the plane defined by the points $p_1$, $p_2$ and $p_3$. T is defined as the triangle defined by $p_1$, $p_2$ and $p_3$. C is revised to represent the projection into the new PL of the center of gravity. PL now represents the first seating plane in which we know that three lead tips may be found. PL is in fact a final seating plane if C, the projection of the center of gravity, lies within the triangle T. If C lies on the triangle T, then two separate resting planes exist and the package is known as a "rocker". If the package is a rocker, then it must pass coplanarity for both its seating planes. Thus, in step 520, the test is made as to whether C lies on or within T. If so, in step 522, the second portion of the coplanarity procedure begins, and the lead tip having the greatest distance from PL is located. If that distance d exceeds the coplanarity limit (step 524), then the part is rejected (step 526). If not, then a determination must be made as to whether the package is a rocker (step 528). If it is a rocker, and it is the first time that conclusion has been reached (step 529) then control is returned to step 514 since one more iteration is necessary. If the package is not a rocker (step 528), or if the coplanarity test has already been performed for both seating planes (step 529), then the part satisfies the coplanarity test and the routine is exited (step 530).

If in step 520 C is found not to lie within or on T, or in step 528, C is found to lie on T, then the next roll axis will depend on which line segment, s $\overline{p_1p_3}$ or $\overline{p_2p_3}$, is between $\overline{p_1p_2}$ and C (or includes C). This test is made in step 532. If $\overline{p_1p_3}$ is between $\overline{p_1p_2}$ and C then the value of $p_0$ is changed to the former value of $p_2$, a lead tip now known to be on the opposite side of the next roll axis from C, and not to lie in the final seating plane (step 534). The value of $p_2$ is modified to the former value of $p_3$, with $p_1$ remaining the same, and control is transferred back to step 514 where the next roll axis is determined as the line passing through $p_1$ and the new $p_2$. If in step 532 $\overline{p_2p_3}$ was found to be between $\overline{p_1p_2}$ and C, then the value of $p_0$ is changed to that of former $p_1$, the value of $p_1$ is changed to the value of former $p_3$ (step 536), and with $p_2$ remaining unchanged, control is transferred to step 514 where the next roll axis L is defined as the line passing through the new $p_1$ and $p_2$. The iteration of steps 514, 516, 518, 520, 532 and 534 or 536 is repeated until step 520 produces a positive result and the final seating plane is found.

The algorithm of FIG. 19 iteratively updates the plane position PL, rather than the more natural method of leaving PL constant as a plane parallel to $z=0$ and iteratively revising the positions of the lead tips $p_i$. While this is not necessary to the invention, it does provide a number of important advantages. First, a plane may be represented by its unit normal vector, which is easily calculated from three known points in the plane. Coordinate transformations of the lead tips would require modification of the values held for each of the lead tips, which may number up to 84 or more. Second, each new plane is determined from the three lead tip centers which define it, not from any trigonometric operation of the previous plane. Iterative trigonometric calculations are therefore avoided, as well as their low speed and large compounded roundoff errors.

The present discussion will be more concrete if a real example is used. It is convenient to treat the lead tip centers as vectors, so certain notational conventions will be introduced. $V_n$ refers to the position vector whose end touches the tip of pin n. If the coordinates of pin are $<x_n, y_n, z_n>$ then the components of vector $V_n$ are given as $<x_n, y_n, z_n>$; thus $V_1 = <x_1, y_1, z_1>$. The center of gravity is a special case and it is defined to be $C = <x_c, y_c, z_n>$, where n is the number of the pin that is initially closest to the reference plane $z=0$. $V_n * V_m$ indicates the dot product between vectors $V_n$ and $V_m$ and the cross product is given by $V_n \times V_m$. Also, an uppercase letter followed by a u indicates a unit vector; e.g. Au.

Assume the package is oriented so that its sides are parallel to the x and y axes of a Cartesian plane, the left vertical side being coincident with the positive y axis and the bottom side being coincident with the positive x axis. Assume further that there are 11 pins per side. The package body is 600 units wide and the spacing between pins is 50 units. Each of the lead tips are given their measured $z_i$, but their measured $x_i$ and $y_i$ positions are ignored. Instead the $x_i$ and $y_i$ are given the values corresponding to the idealized values as shown in FIG. 20. This simplifies the analysis and is highly unlikely to affect the result of the coplanarity test, since if these values were so far off as to affect coplanarity, then the part would certainly have already failed other tests such as sweep or spread. The convention will be to number each pin starting with the leftmost pin on the top side and continuing around in a loop. Some of the pins are shown numbered, with coordinates given, in FIG. 20.

Suppose pin 3 is closest to the initial reference plane. The unit normal to this plane is $Nu = <0,0,1>$. Also, there is a parallel plane defined by $z=z_3$ and $V_3$ is touching this plane. The initial axis of rotation will be perpendicular to the vector $D = C - V_3 = <x_c-x_3, y_c-y_3, z_3-z_3>$ and it lies in the plane $z=z_3$. We wish to rotate this plane until the next pin touches. However, we are only interested in pins on the same side of the rotational axis as the center of gravity. The axis of rotation will pass through pin 3 and will intersect side 4. The vector $A = <0,y,z_3> - <x_{3L},y_3,z_3>$ is orthogonal to D and therefore $0 = A * D$. Solving this equation shows that the axis of rotation intersects the y axis at $x_3(x_3-x_3)/(y_c-y_3)+y_3$. Using the dimensions given for the chip in FIG. 20, it can be seen that $y=525$ and concluded that the axis of rotation lies between pin 43 and pin 44. Therefore we only examine pins 4 through 43 looking for the pin closest to the plane $z=z_3$.

Before the search begins we first derive the unit vector $Au = A/|A|$, which is parallel to the axis of rotation. If we are examining pin n then we first obtain the vector $Q_n = V_n - V_3$. Taking the dot product $d = Au * Q_n$ gives the projection of $Q_n$ onto Au and the vector $P_n = Q_n - dAu$ is a position vector perpendicular to A. See FIG. 21a.

We now wish to find the pin that is closest to the plane and this will be the one that produces the largest angle, $\theta$, between $P_n$ and Nu (see FIG. 21b). Since $\cos(\theta) = (Nu*P_n)/|P_n|$ and $\theta$ is large when $\cos(\theta)$ is small, we need only find the smallest $\cos(\theta)$ and remember which pin is associated with it.

Continuing with the example, assume that pin 41 is the closest pin to the plane $z=z_3$. If $N' = Au \times (V_{41} - V_3)$, then Nu' is the unit normal to the plane containing the initial axis of rotation and the line through pin 3 and pin 41 and this line becomes the new axis of rotation. Actually, we must test to see if the z component is less than zero; if it is, then we multiply N' by the scalar $-1$ to ensure we are on the positive side of the plane. We again go through the procedure described above and find that pin 13 is closest to the plane with normal N'. And we see that the normal to the plane containing the three pins 3, 41, and 13 is $N'' =$ plus or minus $(V_{41}-V_3) \times (V_{13}-V_3)$.

We at last have three pins sitting on a plane and we now must determine whether this is the seating plane. That is to say, will the projection of C onto the plane $z=0$ be on or within the triangle formed by the projections of $V_3$, $V_{41}$, and $V_{13}$ onto the that same plane? These projections are $C' = (x_c,y_c,0)$, $V_3' = (x_3,y_3,0)$, $V_{41}' = (x_{41},y_{41}, 0)$, and $V_{13}' = (x_{13},y_{13}, 0)$. (As used in this description, the term "projection" refers to a projection parallel to the unit vector $<0,0,1>$). Now let $CC = C' - V_3'$, $P_1 \times V_{41}' - V_3'$, $P_2 = V_{13}' - V_3'$. If CC lies between $P_1$ and $P_2$, then the z components of $CC \times P_1$ and $CC \times P_2$ are opposite in sign. Thus if the signs are equal, we see that the center of gravity lies outside the triangle. However, in the example, CC lies between the vectors $P_1$ and $P_2$ (see FIG. 21a), so we must carry the investigation further. This time let $CC' = C' - V_{13}'$, $P_1' = V_3' - V_{13}'$, and $P_2' = V_{41}' - V_{13}'$. If the z components of $CC' \times P_1'$ and $CC' \times P_2'$ are opposite in sign then the center of gravity lies inside the triangle. The example shows that the signs are equal and we conclude that the center of gravity does not lie within the triangle (see FIG. 21b). (As a special case if $CC \times P_n$ or $CC' \times P_n'$ ($n=1, 2$) is zero, then the center of gravity is on the triangle and there are two possible resting planes.) We are also able to conclude that $P_2'$ lies between $P_1'$ and $CC'$ and so the new axis of rotation will be the line that passes through pin 41 and pin 13. Since N'' is the normal to the plane containing pins 3, 41 and 13, we repeat the procedure described above in order to find the pin closest to this plane and test the new triangle to see if it contains the center of gravity. This procedure is repeated until the resting plane is found.

Once the resting plane is found it can be determined whether all pins are within an acceptable distance from it. If N is the normal to the resting plane, then Nu is the unit normal vector and $d_n = V_n * Nu$ gives the length of the projection of $V_n$ onto Nu. All pins are tested and if any $d_n$ exceeds the permitted tolerance the chip is rejected.

The invention has been described with respect to particular embodiments thereof. Numerous variations of these embodiments will be apparent to those skilled in the art. For example, though the above embodiments use only two detection regions, it is possible to extract position information using three or more discrete detection regions, or using a CCD diode array with a suitable amplifier-readout scheme to measure the light intensity at the measuring plane. As another example, it is possible to measure edge position using a penumbral technique with a non-uniform light source and a detailed measurement of the light distribution in the measurement plane. For certain well-defined and reproducible distributions, this measurement can be done with two detection regions, or it can be done with many detection regions as described above. The key is that the light output distribution of the source be predictable, or correction means be employed to compensate to the extent of any unpredictability. As another example, the light source may be passed through a diffuser or other member in order to average any nonuniformities. The inclusion of such a member could avoid the need for recalibration of the system if the light source is changed. All these variations and others are intended to be within the scope of the invention.

APPENDIX

FIG. 23 shows a side view of an optical head. Light emanating from the source passes through the aperture and strikes detectors 1 and 2. An edge placed between the aperture and detectors reduces the amount of light incident upon the detectors.

Consider a point source at position A on a line of point sources, and a point on the detector at position B. Then Lambert's Cosine Law states that the illumination at B from the point source at A is proportional to the cosine of the angle between the normal to the detector surface and the line segment $\overline{AB}$. This is formally expressed as $$I_B = \frac{k\cos\theta}{AB}$$

where k is a constant. Thus the total illumination on a detector running from $z_b$ to $z_t$ is $$I = \int_{z_b}^{z_t} \int_{\alpha_1(z)}^{\alpha_2(z)} \frac{k\cos\theta}{r^2} d\alpha dz \qquad \text{(eq. 1)}$$

where $[\alpha_1(z), \alpha_2(z)]$ is the portion of the source which is visible from the point z on the detector and $\theta$ and r are:

$$r = \sqrt{d^2 + (z-\alpha)^2} \; ; \; \theta = \cos^{-1} d/r$$

See FIG. 24.

It is convenient to introduce a variable $\gamma = z - \alpha$ such that $\gamma_i = z - \alpha_i$ with i=1, 2 for bottom and top, respectively, of the part of the light source which is visible at point z on one of the detectors. See FIG. 24. Then $$I = \int_{z_b}^{z_t} \int_{\gamma_1(z)}^{\gamma_2(z)} \frac{-k\cos\theta}{r^2} d\gamma dz = \qquad \text{(eq. 2)}$$

$$\int_{z_b}^{z_t} \int_{\gamma^1(z)}^{\gamma^2(z)} \frac{-kd}{(d^2 + \gamma^2)^{3/2}} d\gamma dz$$

Solving the inner integral yields $$I = -K \int_{z_b}^{z_t} \left[ \frac{\gamma}{\sqrt{d^2 + \gamma^2}} \Big|_{\gamma_1(z)}^{\gamma_2(z)} \right] dz \text{ where } K = \frac{k}{d} \qquad \text{(eq. 3)}$$

We need the value of this integral in 2 cases:
Case 1: The open case when no edge is present and full illumination occurs.
Case 2: When an edge is in the shaded triangle and partial illumination occurs as shown in FIG. 25.
In this case, the portion of the slit visible to each point on the detector is bounded above by the edge and below by the bottom of the aperture (i.e., each point of the detector is in the partial shadow of the edge but not in the complete shadow).

In both of these cases the bounds $\gamma_i(y)$ are of the form $$\gamma_i(z) = \frac{d(z - \hat{\gamma}_i)}{\bar{\gamma}_i}$$

where $\hat{\gamma}_i$ and $\bar{\gamma}_i$ are constants. Thus $$r = \sqrt{d^2 + \gamma_i(z)^2} = \frac{d}{\bar{\gamma}_i} \sqrt{\bar{\gamma}_i^2 + (z - \hat{\gamma}_i)^2}$$

In the first case (no edge), $$\bar{\gamma}_1 = h \qquad \bar{\gamma}_2 = h$$
$$\hat{\gamma}_1 = -a \qquad \hat{\gamma}_2 = a$$

In the second case, with an edge at (y,e), $$\bar{\gamma}_1 = h \qquad \bar{\gamma}_2 = h$$
$$\hat{\gamma}_1 = -a \qquad \hat{\gamma}_2 = e$$

Substituting into (3) we get $$I = -K \left[ \int_{z_b}^{z_t} \frac{z - \hat{\gamma}_2}{\sqrt{\bar{\gamma}_2^2 + (z - \hat{\gamma}_2)^2}} - \frac{z - \hat{\gamma}_1}{\sqrt{\bar{\gamma}_1^2 + (z - \hat{\gamma}_1)^2}} dz \right] \qquad \text{(eq. 4)}$$

Integrating and substituting we get:

$$I_{open} = -K \left( \sqrt{h^2 + (z-a)^2} \Big|_{z_b}^{z_t} - \sqrt{h^2 + (z+a)^2} \Big|_{z_b}^{z_t} \right) \qquad \text{(eq. 5)}$$

$$I(y,e) = -K \left( \sqrt{y^2 + (z-e)^2} \Big|_{z_b}^{z_t} - \sqrt{h^2 + (z+a)^2} \Big|_{z_b}^{z_t} \right) \qquad \text{(eq. 6)}$$

Since h, a, $z_t$, and $z_b$ are geometric constants of the optics head, K can be calculated from (5) if $I_{open}$ is measured. Thus, $$K = \frac{-I_{open}}{(\sqrt{h^2 + (z_t-a)^2} - \sqrt{h^2 + (z_b-a)^2}) - (\sqrt{h^2 + (z_t+a)^2} - \sqrt{h^2 + (z_b+a)^2})} \qquad \text{(eq. 7)}$$

(6) can now be rewritten as:

$$\sqrt{y^2 + (z_t - e)^2} - \sqrt{y^2 + (z_b - e)^2} = \frac{-I(y,e)}{K} + \qquad \text{(eq. 8)}$$

$$(\sqrt{h^2 + (z_t + a)^2} - \sqrt{h^2 + (z_b + a)^2})$$

Once we have found K and have measured I(y,e), the right hand side of (8) is a known constant. In fact, (8) is the equation of a hyperbola in variables y and e with a focii at $(0,z_t)$ and $(0,z_b)$. A given measured illumination I(y,e) will be obtained for all edge positions (y,e) lying on a certain hyperbola. Different illuminations correspond to different hyperbolae in the family of hyperbolae with these focii. Measuring the illumination on detector 1 tells us that the edge lies on a certain hyperbola with focii at $(0,z_{t1})$ and $(0,z_{b1})$. Measuring the illumination on detector 2 tells us that the edge also lies on another hyperbola with focii at $(0,z_{t2})$ and $(0,z_{b2})$. The intersection of these two hyperbolae gives us the unique location of the edge.

Let $I_i(y,e)$ be the illumination on detector i (i=1,2) and $K_i$ be the constant K for detector i. Let $$v_i = \frac{-I_i(y,e)}{K_i} + \sqrt{h^2 + (z_{ti} + a)^2} - \sqrt{h^2 + (z_{bi} + a)^2}$$

Then the 2 hyperbolae are:

$$\sqrt{y^2 + (z_{ti} - e)^2} - \sqrt{y^2 + (z_{bi} - e)^2} = v_i$$

To rationalize these equations we write $$\sqrt{y^2 + (z_{ti} - e)^2} = v_i + \sqrt{y^2 + (z_{bi} - e)^2}$$

square: $y^2 + (z_{ti} - e)^2 =$ $$v_i^2 + 2v_i\sqrt{y^2 + (z_{bi} - e)^2} + y^2 + (z_{bi} - e)^2$$

rearrange: $(z_{ti} - e)^2 - (z_{bi} - e)^2 - v_i^2 = 2v_i\sqrt{y^2 + (z_{bi} - e)^2}$ square: $[(z_{ti} - z_{bi})(z_{ti} + z_{bi} - 2e) - v_i^2]^2 =$ $$4v_i^2 y^2 + 4v_i^2(z_{bi} - e)^2$$

Let $\bar{z}_i = (z_{ti} + z_{bi})/2$ (this is the center of detector $i$ with coordinates $(0, \bar{z}_i)$)

Let $\delta_i = z_{ti} - z_{bi}$ (the detector height)

Then $[2\delta_i(\bar{z}_i - e) - v_i^2]^2 - 4v_i^2\left(\bar{z}_i - \frac{\delta_i}{2} - e\right)^2 = 4v_i^2 y^2$ $4\delta_i^2(\bar{z}_i - e)^2 - 4\delta_i v_i^2(\bar{z}_i - e) + v_i^4 - 4v_i^2(\bar{z}_i - e)^2 +$ $$4v_i^2\delta_i(\bar{z}_i - e) - v_i^2\delta_i^2 = 4v_i^2 y^2$$

$4(\delta_i^2 - v_i^2)(\bar{z}_i - e)^2 + v_i^4 - v_i^2\delta_i^2 = 4v_i^2 y^2$ $(\delta_i^2 - v_i^2)(\bar{z}_i - e)^2 + \frac{v_i^2(v_i^2 - \delta_i^2)}{4} = v_i^2 y^2$ Let $\beta_i = \delta_i^2 - v_i^2$ Then we get $$\beta_i(\bar{z}_i - e)^2 - \frac{v_i^2 \beta_i}{4} = v_i^2 y^2 \quad \text{(eq. 10)}$$

$$\beta_1(\bar{z}_1 - e)^2 - \frac{v_1^2 \beta_1}{4} = v_1^2 y^2 \quad \text{(eq. 10a)}$$

$$\beta_2(\bar{z}_2 - e)^2 - \frac{v_2^2 \beta_2}{4} = v_2^2 y^2 \quad \text{(eq. 10b)}$$

Multiplying (10a) by $v_2^2$ and (10b) by $v_1^2$, we can eliminate $y$:

$$v_2^2\beta_1(\bar{z}_1 - e)^2 - \frac{v_1^2 v_2^2 \beta_1}{4} = v_1^2\beta_2(\bar{z}_2 - e)^2 - \frac{v_1^2 v_2^2 \beta_2}{4} \quad \text{(eq. 11)}$$

$(v_2^2\beta_1 - v_1^2\beta_2)e^2 - 2(v_2^2\beta_1\bar{z}_1 - v_1^2\beta_2\bar{z}_2)e + v_2^2\beta_1\bar{z}_1^2 -$ $$v_1^2\beta_2\bar{z}_2^2 - \frac{v_1^2 v_2^2}{4}(\beta_1 - \beta_2) = 0$$

(11) is a quadratic equation $$Ae^2 + Be + C = 0 \quad \text{(eq. 12)}$$

with coefficients:

$A = v_2^2\beta_1 - v_1^2\beta_2$ $B = -2(v_2^2\beta_1\bar{z}_1 - v_1^2\beta_2\bar{z}_2)$ -continued $$C = v_2^2\beta_1\bar{z}_1^2 - v_1^2\beta_2\bar{z}_2^2 - \frac{v_1^2 v_2^2}{4}(\beta_1 - \beta_2)$$

Numerical Solution

To find $e$, equation (12) can be solved with the quadratic formula $$e = -B \pm \frac{\sqrt{B^2 - 4AC}}{2A}$$

If the terms in the numerator nearly cancel, calculation errors in the quotient may be excessive, so sometimes the alternate form $$e = \frac{2C}{-B \pm \sqrt{B^2 - 4AC}}$$

must be used.

In each case the desired root may be found by choosing the appropriate one of the following four expressions.

$$\frac{-B + \sqrt{B^2 - 4AC}}{2A} \quad \text{(i)}$$

$$\frac{2C}{-B - \sqrt{B^2 - 4AC}} \quad \text{(ii)}$$

$$\frac{-B - \sqrt{B^2 - 4AC}}{2A} \quad \text{(iii)}$$

$$\frac{2C}{-B + \sqrt{B^2 - 4AC}} \quad \text{(iv)}$$

Expressions (i) and (ii) are equal if there is no numerical error. Similarly, (iii)=(iv). Expression (i) or (iv) should be used if B is negative; expression (ii) or (iii) should be used if B is positive. This avoids cancellation in the sum.

Choosing Which Root

From equation (9) note that if $v_i > 0$ then $(y,e)$ is further from $(0, z_{ti})$ than from $(0, z_{bi})$, so we want the downward pointing branch of the hyperbola; we want the upward pointing branch if $v_i < 0$. Note: if $v_i = 0$, the hyperbola degenerates into a single line. If we ignore degenerate cases, the situation falls into one of the eight cases shown in FIG. 26. We assumed there that $v_1 \neq 0$, $v_2 \neq 0$, and $A \neq 0$. The significance of A is explained below. The eight cases shown in FIG. 26 are:

(a) $v_1 > 0$, $v_2 > 0$, $\bar{z}_1 > \bar{z}_2$, $A > 0$ (sign of A determines which hyperbola is steeper)

(b) $v_1 > 0$, $v_2 > 0$, $\bar{z}_1 < \bar{z}_2$, $A < 0$ (c) $v_1 < 0$, $v_2 < 0$, $\bar{z}_1 > \bar{z}_2$, $A < 0$ -continued (d)
$v_1 < 0$
$v_2 < 0 \quad \tilde{z}_1 < \tilde{z}_2 \quad A > 0$ (e)
$v_1 > 0$
$v_2 < 0 \quad \tilde{z}_1 < \tilde{z}_2 \quad A > 0$ (f)
$v_1 > 0$
$v_2 < 0 \quad \tilde{z}_1 < \tilde{z}_2 \quad A < 0$ (g)
$v_1 < 0$
$v_2 > 0 \quad \tilde{z}_1 > \tilde{z}_2 \quad A > 0$ (h)
$v_1 < 0$
$v_2 > 0 \quad \tilde{z}_1 > \tilde{z}_2 \quad A < 0$ The solution appears to be well behaved as various variables pass through 0. Experience and a preliminary analysis bear this out. In studying the possibilities note that A and B cannot both be near zero if the detectors are reasonably separated.

To see which hyperbola is steeper, look at the equation of the asymptotes:

$$\beta_i(\tilde{z}_i - e)^2 = v_i^2 y^2 \quad (c.f. (10)) \qquad \text{(eq. 13)}$$

i.e., $\pm \sqrt{\beta_i} \, (\tilde{z} - e) = v_i y$

The slopes are thus $$\pm \frac{v_i}{\sqrt{\beta_i}}$$

Hyperbola 2 is steeper than hyperbola 1

$$< = > \left| \frac{v_2}{\sqrt{\beta_2}} \right| > \left| \frac{v_1}{\sqrt{\beta_1}} \right| < = > \frac{v_2^2}{\beta_2} > \frac{v_1^2}{\beta_1} < = > v_2^2 \beta_1 > v_1^2 \beta_2 < = > A > 0 \text{ since } A = v_2^2 \beta_1 - v_1^2 \beta_2$$

(The $\beta_i$ are $> 0$-See (13))

Note that the root represented by (i) and (ii) is the larger root if A>0 or the smaller roof if A<0.
So,

| | case |
|---|---|
| want expression (i) or (ii) if want larger root and A>0 | (a), (e) |
| (or,) want smaller root and A<0 | (c), (f) |

Otherwise, we want expression (iii) or (iv).

Note that $v_1 v_2(\tilde{z}_1 - \tilde{z}_2) > 0$ in cases (a), (c), (e), (f) and that it is $<0$ otherwise.

Thus, we can use the sign of this expression and the sign of B to see if we want (i), (ii), (iii) or (iv).

| $v_1 v_2(\tilde{z}_1 - \tilde{z}_2)$ | B | expression |
|---|---|---|
| + | + | (ii) |
| + | − | (i) |
| − | + | (iii) |
| − | − | (iv) |

We claim:

1. Apparatus for at least partially determining a coordinate position at which an edge of a workpiece intersects a sensing plane, the sensing plane containing a z-axis, the apparatus comprising:
    source means for emitting energy from a source region intersecting the sensing plane, the energy striking the edge such that the edge creates a shadow having a first penumbra having a non-zero z-dimension, the first penumbra having an intensity-of-shadow which varies in the z-dimension,
    first detection means for detecting the amount of energy which reaches a first known detection region which lies wholly within the first penumbra, the first known detection region intersecting the sensing plane and having a non-zero z-dimension where it intersects the sensing plane; and
    means for determining a first relationship between the coordinate positions of the edge in the sensing plane in response to the first detection means.

2. Apparatus according to claim 1, wherein the source means emits electromagnetic energy, and the edge is substantially opaque at the frequency of the electromagnetic energy.

3. Apparatus according to claim 2, further comprising:
    means for determining a second relationship between the coordinate positions of the edge in the sensing plane; and
    means for solving the first relationship as a simultaneous equation with the second relationship to fully determine the position at which the edge passes through the sensing plane.

4. Apparatus according to claim 2, wherein the energy emanating from the source region forms a beam which has a cross-sectional shape narrower when it reaches the edge than the width of the edge.

5. Apparatus according to claim 2, wherein the source means comprises:
    a light source; and
    shield means for blocking light from the light source which is outside a strip, the strip having its major access lying substantially in the sensing plane and parallel to the z-axis.

6. Apparatus according to claim 2, further comprising:
    second detection means for detecting the amount of energy which reaches a second known detection region which lies wholly within the first penumbra, the second known detection region intersecting the sensing plane and having a non-zero dimension where it intersects the sensing plane;
    means for determining a second relationship between the coordinate positions of the edge in the sensing plane in response to the second detection means; and
    means for solving the first relationship as a simultaneous equation with the second relationship to fully determine the position at which the edge passes through the sensing plane.

7. Apparatus according to claim 6, wherein the sensing plane includes a working area, and wherein the source region and the first and second known detection regions are essentially line segments oriented substantially in the z-dimension, the source region and the first and second known detection regions being disposed such that energy emanating from the source region must cross the working area before reaching the first and second known detection regions.

8. Apparatus for determining the position in which an edge of a workpiece intersects a sensing plane parallel to a z-axis, the apparatus comprising:

source means for emitting energy from a source region intersecting the sensing plane, the energy striking the edge such that the edge creates a shadow having a first penumbra, the first penumbra having an intensity-of-shadow which varies in the z-dimension;

first detection means for detecting the amount of energy which reaches a first known detection region in the first penumbra, the first known detection region intersecting the sensing plane and having a non-zero z-dimension where it intersects the sensing plane; and second detection means for detecting the amount of energy which reaches a second known detection region in the first penumbra, the second known detection region intersecting the sensing plane and having a non-zero z-dimension where it intersects the sensing plane.

9. Apparatus according to claim 8, wherein the sensing plane includes a working area, and wherein the source region and the first and second known detection regions are essentially line segments oriented substantially in the z-dimension, the source region and the first and second known detection regions being disposed such that energy emanating from the source region must cross the working area before reaching the first and second known detection regions.

10. Apparatus for inspecting a protrusion on a workpiece, the protrusion having opposing first and second edges, the apparatus comprising:

source means for emitting electromagnetic energy onto the first and second edges such that the first edge creates a shadow having a first penumbra having a non-zero size in a dimension perpendicular to the first edge, and such that the second edge creates a shadow having a second penumbra having a non-zero size in a dimension perpendicular to the second edge;

first detection means for detecting the amount of energy which reaches a first known detection region in the first penumbra; and second detection means for detecting the amount of energy which reaches a second known detection region in the second penumbra.

11. Apparatus for inspecting a workpiece, the workpiece having an edge, the apparatus being associated with a coordinate system having an origin and mutually perpendicular, x, y and z axes extending from the origin, the apparatus being further associated with a sensing plane parallel to the y-z plane, the apparatus comprising:

source means for emitting energy from a known source region, the known source region having a non-zero z-dimension and being no wider in the x-dimension than a desired width, the source region consisting of a set of source points;

means for staging the workpiece such that the edge passes through the sensing plane and blocks part of the energy emitted from the known source region to thereby create a shadow having a penumbra indicative of the y-z coordinate position of the edge, the penumbra having an intensity-of-shadow which varies at least in the z-dimension; and means for outputting a first signal indicative of the amount of energy which reaches a first known detection region in the penumbra from the source means.

12. Apparatus according to claim 11, wherein the source means emits electromagnetic energy and wherein the edge is substantially opaque at the frequency of the electromagnetic energy.

13. Apparatus according to claim 12, further comprising means for determining a first relationship between the y and z coordinates of the point where the edge passes through the sensing plane.

14. Apparatus according to claim 13, further comprising means for determining a second relationship between the y and z coordinates of the point where the edge passes through the sensing plane; and means for determining the y and z coordinates through the use of a simultaneous solution of the first relationship and the second relationship.

15. Apparatus according to claim 14, wherein the means for determining a second relationship comprises:

means for outputting a second signal indicative of the amount of energy which reaches a second known detection region in the penumbra from the source means, the second known detection region consisting of a second set of detection points, and means for obtaining the second relationship at least in part by calculating the values of at least one constant in a second formula obtained by solving an integration of the estimated effect on the second signal which would be caused by the incidence on each detection point in the second set of detection points of energy from each source point in the set of source points which is not blocked by the edge.

16. Apparatus according to claim 13, wherein the first known detection region consists of a first set of detection points, and wherein the means for determining comprises means for calculating the values of at least one constant in a first formula obtained by solving an integration of the estimated effect on the first signal which would be caused by the incidence on each detection point in the first set of detection points of energy from each source point in the set of source points which is not blocked by the edge.

17. Apparatus according to claim 16, wherein the known source region is essentially a line segment extending in the sensing plane from $(y,z)=(h,-a)$ to $(y,z)=(h,a)$, and where the first known detection region is essentially a line segment extending in the sensing plane from $(y,z)=(0,z_{b1})$ to $(y,z)=(0,z_{t1})$, wherein said formula is substantially:

$$v_1(y,z) = [y^2+(z_{t1}-z)^2]^{\frac{1}{2}} - [y^2+(z_{b1}-z)^2]^{\frac{1}{2}},$$

where $$v_1(y,z) = \frac{-I_1(y,z)}{K_1} + [h^2 + (z_{t1} + a)^2]^{\frac{1}{2}} - [h^2 + (z_{b1} + a)^2]^{\frac{1}{2}},$$

K is a constant, and $I_1(y,z)$ is the value of the first signal when the edge is at the arbitrary y-z position.

18. Apparatus for inspecting a workpiece, the workpiece having a first side surface and a base surface, the workpiece having a plurality of edges including a first body edge at a meeting between the first side surface and the base surface, the plurality of edges further including a subject edge, the apparatus being associated with a coordinate system having an origin and mutually perpendicular x, y and z axes extending from the origin, the apparatus being further associated with a sensing plane parallel to the y-z plane, the apparatus comprising:

source means for emitting energy from a known source region, the known source region having a non-zero z-dimension and being no wider in the x-dimension than a desired width, the source region consisting of a set of source points;

means for staging the workpiece such that the subject edge passes through the sensing plane and blocks part of the energy emitted from the known source region to thereby create a shadow having a penumbra indicative of the position of the subject edge, the penumbra having an intensity-of-shadow which varies at least in the z-dimension;

means for outputting a first signal indicative of the amount of energy which reaches a first known detection region in the penumbra from the source means, the first known detection region consisting of a first set of detection points; and means for outputting a second signal indicative of the amount of energy which reaches a second known detection region in the penumbra from the source means, the second known detection region consisting of a second set of detection points; and means for determining the z coordinate of the point where the subject edge passes through the sensing plane, including means for calculating values of constants in a formula obtained by solving substantially the two simultaneous equations defined by (1) an integration of the estimated effect on the first signal which would be caused by the incidence on each detection point in the first set of detection points of energy from each source point in the set of source points which would reach such detection point in the first set of detection points if the subject edge is at an arbitrary y-z position, and by (2) an integration of the estimated effect on the second signal which would be caused by the incidence on each detection point in the second set of detection points of energy from each source point in the set of source points which would reach such detection point in the second set of detection points if the subject edge is at the arbitrary y-z position.

19. Apparatus according to claim 18, wherein the source region is essentially a line segment extending in the sensing plane from $(y,z)=(h,-a)$ to $(y,z)=(h,a)$;

wherein the first known detection region is essentially a line segment extending in the sensing plane from $(y,z)=(0,z_{b1})$ to $(y,z)=(0,z_{t1})$;

wherein the second known detection region is essentially a line segment extending in the sensing plane from $(y,z)=(0,z_{b2})$ to $(y,z)=(0,z_{t2})$; and wherein the two simultaneous equations are given by, respectively, $$v_1(y,z)=[y^2+(z_{t1}-z)^2]^{\frac{1}{2}}-[y^2+(z_{b1}-z)^2]^{\frac{1}{2}} \quad (1)$$

and $$v_2(y,z)=[y^2+(z_{t2}-z)^2]^{\frac{1}{2}}-[y^2+(z_{b2}-z)^2]^{\frac{1}{2}}; \quad (2)$$

where $$v_1(y,z) = \frac{-I_1(y,z)}{K_1} + [h^2+(z_{t1}+a)^2]^{\frac{1}{2}}-[h^2+(z_{b1}+a)^2]^{\frac{1}{2}},$$

$$v_2(y,z) = \frac{-I_2(y,z)}{K_2} + [h^2+(z_{t2}+a)^2]^{\frac{1}{2}}-[h^2+(z_{b2}+a)^2]^{\frac{1}{2}},$$

$K_1$ and $K_2$ are constants, $I_1(y,z)$ is the estimated value of the first signal when the subject edge is at an arbitrary y-z position, and $I_2(y,z)$ is the estimated value of the second signal when the subject edge is at the arbitrary y-z position.

20. Apparatus according to claim 19, wherein the means for determining further includes means for inserting for $I_1(y,z)$ the actual value of the first signal as modified by an empirically determined correction term.

21. Apparatus according to claim 20, wherein the means for staging comprises means for moving the workpiece relative to the y-z plane in a direction not substantially parallel to the y-z plane, further comprising means for determining the x-coordinate of the sensing plane.

22. Apparatus for determining an edge profile of edges on a side of a workpiece, the apparatus having associated therewith an x-y-z Cartesian coordinate system, the apparatus comprising:

source means for emitting energy from a known source region, the known source region having a non-zero z-dimension and including a source point;

staging means for staging the workpiece such that one of the edges blocks part of the energy emitted by the source means to thereby create a shadow having a penumbra with an intensity-of-shadow which varies in the z-dimension.

first detection means for detecting the amount of energy emitted from the known source region which reaches a first known detection region in the penumbra, the first known detection region including a first detection point; and moving means for relatively moving the workpiece with respect to the first known detection region in a direction not substantially parallel to any plane which is parallel to the z-axis and which passes through both a point in the known source region and a point in the first known detection region.

23. Apparatus according to claim 22, wherein the source means for emitting energy emits electromagnetic energy, and the edges are substantially opaque at the frequency of the electromagnetic energy.

24. Apparatus according to claim 23, wherein the z-axis passes through the first detection point, the y-axis is perpendicular to the z-axis and passes through the source point and the x-axis is perpendicular to the y- and z-axes, and wherein the moving means relatively moves the workpiece with respect to the known source region and the first known detection region in a direction substantially parallel to the x-axis, further comprising means responsive to the first detection means for reading the amount of energy detected at the first known detection region for at least two relative x-positions of the workpiece.

25. Apparatus according to claim 24,
wherein the known source region is a narrow strip extending substantially in the z-direction, bounded in the z-dimension substantially by $z=z_{ts}$ and $z=z_{bs}$, and bounded in the x-dimension substantially by $x=x_{cs}\pm x_s$, where $x_{cs}$ is the x-coordinate of a point in the known source region;

wherein the first known detection region is a narrow strip extending substantially in the z-direction, bounded in the z-dimension substantially by $z=z_{t1}$ and $z=z_{b1}$, and bounded in the x-dimension substantially by $x=x_{c1}\pm x_1$, where $x_{c1}$ is the x-coordinate of a point in the first known detection region;

wherein the source means comprises:

overall source means for emitting energy from an overall source region having a z-dimension which extends above $z=z_{ts}$ and below $z=z_{bs}$, and which is wider in the x-dimension than $2x_s$;

first source shield means for blocking energy emanating from the overall source region at a position above $z=z_{ts}$ or below $z=_{bs}$; and second source shield means for blocking energy emanating from the overall source region at a position having an x-coordinate outside the range $x=x_{cs}\pm x_s$, but leaving unaffected any energy which may emanate from the overall source region at a position above $z=z_{ts}$ or below $z=z_{bs}$;

wherein the first detection means comprises:

means for detecting the amount of energy which reaches a first overall detection region extending in one x-direction beyond a relative x-position $x=x_{min}$ and in the other x-direction beyond a relative x-position $x=x_{max}$, $x_{min}$ and $x_{max}$ being the minimum and maximum desired relative x-positions for the y-z plane, respectively, the first overall detection region being further bounded substantially by $z=z_{t1}$ and $z=z_{b1}$; and first detector shield means for blocking energy from reaching the first overall detection region at a position having an x-coordinate outside the range $x=x_{c1}\pm x_1$, but leaving unaffected any energy which may otherwise pass the first overall detection region above $z=z_{t1}$ or below $z=z_{b1}$;

and wherein the moving means moves the second source shield means and the first detector shield means while the workpiece, the first source shield means and the first overall detection region remain fixed.

26. Apparatus according to claim 24,
wherein when the y-z plane is at a given x-position the first known detection region is bounded in the x-dimension substantially by $x=x_{c1}\pm x_1$, where $x_{c1}$ is the x-coordinate of a point in the first known detection region, wherein the first detection means comprises means for detecting the amount of energy which reaches a first overall detection region extending in one x-direction beyong a relative x-position $x=x_{min}$ and in the other x-direction beyond a relative x-position $x=x_{max}$, $x_{min}$ and $x_{max}$ being the minimum and maximum desired relative x-positions, respectively, for the y-z plane; and first detector shield means for blocking energy from reaching the first overall detection region at a position having an x-coordinate outside the range $x=x_{c1}\pm x_1$;

and wherein the moving means moves the first detector shield means while the workpiece and the first overall detection region remain fixed.

27. Apparatus according to claim 26,
wherein when the y-z plane is at the given x-position the first known detection region is further bounded above substantially by $z=z_{t1}$ and bounded below substantially by $z=z_{b1}$, wherein the first overall detection region is bounded substantially by $z=z_{t1}$ and $z=z_{b1}$ for all relative positions of x between $x_{min}$ and $x_{max}$, and wherein the first detector shield means leaves unaffected any energy which may otherwise pass the first overall detection region above $z=z_{t1}$ or below $z=z_{b1}$.

28. Apparatus according to claim 24, wherein when the y-z plane is at a given relative x-position the known source region is bounded above substantially by $z=z_{ts}$ and bounded below substantially by $z=z_{bs}$, wherein the source means comprises:

overall source means for emitting energy from an overall source region having a z-dimension which extends above $z=z_{ts}$ and below $z=z_{bs}$; and first source shield means for blocking energy emanating from the overall source region at a position above $z=z_{ts}$ or below $z=z_{bs}$ when the y-z plane is in the given relative x-position;

and wherein the moving means moves the overall source region, the first known detection region and the second known detection region while the workpiece and the first source shield means remain fixed.

29. Apparatus according to claim 28,
wherein when the y-z plane is at the given relative x-position the known source region is bounded in the x-dimension substantially by $x=x_{cs}\pm x_s$, where $x_{cs}$ is the x-coordinate of a point in the known source region;

wherein the overall source region extends beyond $x=x\pm x_s$ in both x directions;

further comprising second source shield means for blocking energy emanating from the overall source region at a position having an x-coordinate outside the range $x=x_{cs}\pm x_s$, but leaving unaffected any energy which may emanate from the overall source region at a position above $z=z_{ts}$ and any energy which may emanate from the overall source region at a position below $z=z_{bs}$;

wherein the moving means further moves the second source shield means.

30. Apparatus for rotating by a given angle in a given direction about an axis of rotation a substantially rectangular workpiece of arbitrary size, the workpiece having a first side and a second side adjacent to the first side, the apparatus comprising:

means for positioning the workpiece such that the first side lies on a first line spaced from the axis by a first distance and the second side lies on a second line spaced from the axis by a second distance; and means for rotating the positioned workpiece by the given angle in the given direction about the axis;

wherein the first and second distances remain fixed for different sizes of workpieces.

31. Apparatus according to claim 30, wherein the given angle is 90°, wherein the workpiece is substantially square, wherein the first distance is substantially the same as the second distance, and wherein the given direction is that necessary to cause the second side to lie on the first line after the workpiece is rotated by the means for rotating.

32. Apparatus according to claim 31, wherein the means for rotating comprises a platform rotatable about the axis, the platform having suction means having active areas located along a first diagonal passing through the axis and through the intersection between the first line and the second line, and along a second diagonal passing through the axis, the second diagonal making an angle of 90° with the first diagonal.

33. Apparatus according to claim 32, for use in association with a suction pump, wherein the platform has a hole at each of the active areas, each hole having a top end and a bottom end, and wherein the suction means comprises means for placing the suction pump in air pressure communication with the bottom of each of the holes, each of the holes being large enough at its top end to provide a desired holding force when the hole is covered by the workpiece and small enough at its bottom end to provide a desired resistance to air flow when the hole is not covered by the workpiece.

34. Apparatus for rotating a substantially rectangular workpiece of arbitrary size by 90°, the workpiece having a first side and a second side adjacent to the first side, for use in association with an input guide wall, an output guide wall, first means for moving the workpiece along the input guide wall while the first side remains substantially against the input guide wall, the first means for moving stopping when the second side reaches a second line, and second means for moving the workpiece along the output guide wall while the second side remains substantially against the output guide wall, the input guide wall and the output guide wall both lying substantially along a first line, the apparatus comprising:
   a rotation table rotatable about an axis which is spaced from each of the first line and the second line by a distance which is fixed for different sizes of workpieces; and
   means for rotating the rotation table.

35. Apparatus according to claim 34, wherein the workpiece is substantially square, and wherein the rotation table contains suction holes located only along a first diagonal passing through the axis and the intersection between the first line and the second line, and along a second diagonal passing through the axis and angled 90° from the first diagonal.

36. Apparatus according to claim 35, wherein the rotation table has a given thickness, and wherein each suction hole consists of a well which is open on its top end and has a depth less than the given thickness, each well having an opening in its bottom which is much smaller than the size of the opening on the top of the well.

37. Apparatus according to claim 35, for operation with workpieces having no smaller than a minimum side length, and wherein the rotation table contains only first, second, third, fourth and fifth suction holes,
   the first suction hole being centered at a first point on the first diagonal, the first point being half the minimum side length from the first line, the first point being located a certain distance from the axis;
   the second suction hole being centered at a second point on the first diagonal on the opposite side of the axis from the first suction hole, the second point being the certain distance from the axis;
   the third and fourth suction holes being centered at third and fourth points, respectively, on the second diagonal on opposite sides of the axis, the third and fourth points being the certain distance from the axis; and
   the fifth suction hole being centered on the axis.

38. Apparatus for inspecting a workpiece, the workpiece having first, second, third and fourth side surfaces, the apparatus comprising:
   first, second, third and fourth means for determining an edge profile of the edges on one side of the workpiece;
   first, second and third rotation means for rotating the workpiece by a predetermined angle in a predetermined direction, each rotation means having an axis of rotation;
   transport means for transporting the workpiece from the first means for determining an edge profile sequentially to the first rotation means, the second means for determining an edge profile, the second rotation means, the third means for determining an edge profile, the third rotation means and the fourth means for determining an edge profile; and
   means for performing inspection tests on the edge profiles determined by the first, second, third and fourth means for determining an edge profile.

39. Apparatus according to claim 38, wherein at least one of the means for determining an edge profile has associated therewith an x-y-x Cartesian coordinate system and comprises:
   source means for emitting electromagnetic energy from a known source region, the known source region having a non-zero z-dimension;
   first detection means for detecting the amount of energy emitted from the known source region which reaches a first known detection region; and
   moving means for relatively moving the workpiece with respect to the known source region and/or the first known detection region in a direction not substantially parallel to any plane which is parallel to the z-axis and which passes through both a point in the known source region and a point in the first known detection region.

40. Apparatus according to claim 38, wherein a given one of the rotation means comprises:
   means for positioning the workpiece such that the first side lies on a first line spaced from the axis of rotation of the given rotation means by a first distance and the second side lies on a second line spaced from the axis of rotation of the given rotation means by a second distance; and
   means for rotating the positioned workpiece by the predetermined angle in the predetermined direction;
   wherein the first and second distances remain fixed for different sizes of workpieces.

41. A method for use with apparatus for determining the y-z position of an edge passing through a sensing plane parallel to a y-z plane in an x-y-z Cartesian coordinate system, the apparatus comprising:
   source means for emitting electromagnetic energy from a source region which is essentially a line segment extending in the sensing plane from the nominal positions $(y,z)=(h,-a)$ to $(y,z)=(h,a)$;
   first detection means for detecting the amount of energy received at a first known detection region which is essentially a line segment extending in the sensing plane from the nominal positions $(y,z)=(0,z_{b1})$ to $(y,z)=(0,z_{t1})$;

second detection means for determining the amount of energy received at a second known detection region which is essentially a line segment extending in the sensing plane from the nominal positions $(y,z)=(0,z_{b2})$ to $(y,z)=(0,z_{t2})$; and means responsive to the first detection means and the second detection means for calculating an expected y-z position of the edge based on stored values of a, h, $z_{b1}$, $z_{t1}$, $z_{b2}$ and $z_{t2}$, the method comprising the steps of:

reading for at least one known y-z position of a calibration edge the amount of energy detected by the first detection means and the amount of energy detected by the second detection means;

setting up initial test values of the parameters a, h, $z_{b1}$, $z_{t1}$, $z_{b2}$ and $z_{t2}$;

calculating expected position information of the calibration edge based on the read amounts of energy and the current test values of a, h, $z_{b1}$, $z_{t1}$, $z_{b2}$ and $z_{t2}$;

determining an error between the expected position information and the at least one known y-z position of the calibration edge;

repeating the steps of calculating and determining for predetermined numbers of permutations of test values of a, h, $z_{b1}$, $z_{t1}$, $z_{b2}$ and $z_{t2}$; and storing for subsequent use by the means for calculating the test values of a, h, $z_{b1}$, $z_{t1}$, $z_{b2}$ and $z_{t2}$ which were used in the calculating step and which yielded the smallest error in the determining step.

42. A method according to claim 41,
wherein the apparatus has a better resolution in the z-dimension than in the y-dimension,
wherein the step of reading comprises the step of reading the amount of energy detected by the first and second detection means for first and second known y-z positions of the calibration edge, the first and second known y-z positions having essentially identical y-positions,
wherein the step of calculating expected position information comprises the step of calculating the expected y-positions of the calibration edge for each of the first and second known y-z positions of the calibration edge, and
wherein the step of determining an error comprises the step of determining the difference between the expected y-positions of the calibration edge for the first and second known positions of the calibration edge.

43. A method according to claim 41, further comprising the step of repeating for at least one additional x-position of the sensing plane the steps of reading, setting up, calculating, determining, repeating and storing.

44. A method for use with apparatus for determining position information about a first edge of a workpiece, the apparatus comprising:

source means for emitting energy from a known source region, the known source region having a non-zero z-dimension;

first detection means for outputting a first signal nominally indicative of the amount of energy emitted from the source region which reaches a first known detection region; and means for calculating an apparent y-z position of the edge in response to the first signal, the method comprising the steps of:

positioning a calibration edge at a first known y-z position;

calculating for the current known y-z position of the calibration edge an expected value of the first signal;

storing in relation to the nominal value of the first signal a correction term which when applied to the nominal value of the first signal will yield substantially the expected value of the first signal;

moving the calibration edge to a known y-z position at which the first detection means outputs a signal different from that output for any previous y-z position of the calibration edge; and repeating for a desired number of repetitions the steps of calculating, storing and moving.

45. A method according to claim 44, further comprising the step of performing the steps of positioning, calculating, storing, moving and repeating for at least two x-positions.

46. A method according to claim 44, wherein the correction term is the ratio between the expected value of the first signal and the nominal value of the first signal.

47. A method according to claim 44, wherein the step of storing in relation to the nominal value of the first signal a correction term comprises the step of storing the correction term in correspondence with $I_{read}/(I_{open}-I_{closed})$, where $I_{read}$ is the nominal value of the first signal for the current y-z position of the calibration edge, $I_{open}$ is the nominal value of the first signal when the calibration edge blocks none of the energy emitted from the source region from reaching the first detection region, and $I_{closed}$ is the nominal value of the first signal when the calibration edge blocks all of the energy emitted from the source region from reaching the first detection region directly.

48. A method according to claim 47, further comprising the steps of:

storing $(I_{open}-I_{closed})$; and updating the store value of $(I_{open}-I_{closed})$, when the apparatus is in field use.

49. A method according to claim 44, further comprising the steps of:

reading an obtained nominal value of the first signal when the apparatus is in field use;

determining the pair of nominal values of the first signal for which correction terms were stored during the step of storing, which pair correspond most closely with the obtained nominal value; and applying to the obtained nominal value a correction term which is interpolated between the two correction terms stored during the step of storing in relation to the pair of nominal values.

50. A method according to claim 49, wherein the step of storing in relation to the nominal value of the first signal a correction term comprises the step of storing in correspondence: (a) the correction term and (b) an index ratio $I_{read}/(I_{open}-I_{closed})$, where $I_{read}$ is the nominal value of the first signal for the current y-z position of the calibration edge, $I_{open}$ is the nominal value of the first signal when the calibration edge blocks none of the energy emitted from the source region from reaching the first detection region, and $I_{closed}$ is the nominal value of the first signal when the calibration edge blocks all of the energy emitted from the source region from reaching the first detection region directly, further comprising the step of storing ($I_{open} - I_{closed}$); and wherein the step of determining comprises the step of selecting the two stored index ratios which are closest to the ratio between the obtained nominal value of the first signal and the stored value of ($I_{open} - I_{closed}$).

51. Apparatus for inspecting a 4-sided workpiece, the workpiece including a body having a base surface, a first side surface, a second side surface adjacent to the first side surface, a third side surface adjacent to the second side surface and a fourth side surface joining the third and first side surfaces, the workpiece further including first, second, third and fourth body edges at meetings between the base surface and, respectively, the first, second, third and fourth side surfaces, the workpiece further including a first plurality of leads extending from the first side surface, a second plurality of leads extending from the second side surface, a third plurality of leads extending from the third side surface and a fourth plurality of leads extending from the fourth side surface, each lead having a lead tip, the apparatus comprising:

means for obtaining a first item of lead position information concerning at least one of the first plurality of leads, with reference to a first coordinate system, and obtaining the positions of at least two places on the first body edge with respect to the first coordinate system;

means for obtaining a second item of lead position information concerning at least one of the second plurality of leads, with reference to a second coordinate system, and obtaining the positions of at least two points on the second body edge with respect to the second coordinate system;

means for obtaining a third item of lead position information concerning at least one of the third plurality of leads, with reference to a third coordinate system, and obtaining the positions of at least two points on the third body edge with respect to the third coordinate system;

means for obtaining a fourth item of lead position information concerning at least one of the fourth plurality of leads, with reference to a fourth coordinate system, and obtaining the positions of at least two points on the fourth body edge with respect to the fourth coordinate system; and means for interrelating the first, second, third and fourth items of lead position information substantially by applying to the first, second and third items of lead position information respective first, second and third transformations, the first, second and third transformations being such that, when applied respectively to the positions with respect to the first coordinate system of the at least two points on the first body edge, the positions with respect to the second coordinate system of the at least two points on the second body edge and the positions with respect to the third coordinate system of the at least two points on the third body edge, the transformations cause a first line drawn through the at least two points on the first body edge to intersect both a second line drawn through the at least two points on the second body edge and a fourth line drawn through the at least two points on the fourth body edge, cause a third line drawn through the at least two points on the third body edge to intersect both the second line and the fourth line, and cause the first, second, third and fourth lines to be coplanar.

52. Apparatus for testing the tweezing coplanarity of a four-sided IC package, the package including a body having a base surface, a first side surface, a second side surface adjacent to the first side surface, a third side surface adjacent to the second side surface, and a fourth side surface joining the third and first side surfaces, the package further including first, second, third and fourth body edges at meetings between the base surface and, respectively, the first, second, third and fourth side surfaces, the package further including a first plurality of leads extending from the first side surface, a second pluarality of leads extending from the second side surface, a third plurality of leads extending from the third side surface, and a fourth plurality of leads extending from the fourth side surface, each lead extending outward from the body in a direction nominally parallel to the base surface for a respective protrusion distance, then bending at a respective lead shoulder to pass through a base plane containing the base surface in a direction nominally perpendicular to the base plane, a first reference line being defined as the line passing through the lead shoulders of the two leads extending from the first side surface, which two leads have the largest protrusion distances of all the leads extending from the first side surface, a second reference line being defined as the line passing through the lead shoulders of the two leads extending from the second side surface, which two leads have the largest protrusion distances of all the leads extending from the second side surface, a third reference line being defined as the line passing through the lead shoulders of the two leads extending from the third side surface, which two leads have the largest protrusion distances of all the leads extending from the third side surface, a fourth reference line being defined as the line passing through the lead shoulders of the two leads extending from the fourth side surface, which two leads have the largest protrusion distances of all the leads extending from the fourth side surface, the apparatus comprising:

means for indicating a failure if the sum of the distance between the first reference line and the first body edge and the distance between the third reference line and the third body edge differs from a first constant by more than a tweezing coplanarity tolerance, both distances being taken along a projection into the base plane of any perpendicular to the first reference line, which projection intersects both the first body edge and the third body edge; and means for indicating a failure if the sum of the distance between the second reference line and the second body edge and the distance between the fourth reference line and the fourth body edge differs from a second constant by more than the tweezing coplanarity tolerance, both distances being taken along a projection into the base plane of any perpendicular to the second reference line, which projection intersects both the second body edge and the fourth body edge.

53. A method for determining a seating plane of the tips of N leads extending downward from a body, including at least three lead tips which are not all collinear, the method comprising the steps of:

(a) providing in a computer memory representations of a plane and the positions in space of the lead tips relative to each other and to the plane, the plane passing through a group of three of the lead tips, all others of the lead tips being either on the plane or on the same side of the plane as the body, the step of providing including a step of changing in the computer memory in a manner which corresponds to rotation, relative to the plane, of the body about a roll axis the representation of at least one member of the group consisting of the plane and the positions of the lead tips; and (b) while the projection of the center of gravity of the body onto the plane is outside the triangle defined by the group of three of the lead tips, repeating the step of:

modifying in the computer memory in a manner which corresponds to rotation, relative to the plane, of the body about a new roll axis the representation of at least one member of the group consisting of the plane and the positions of the lead tips, until the plane passes through an additional lead tip, the additional lead tip being the lead tip which is first to touch the plane during such rotation, the new roll axis being defined as the line which contains a first line segment or a second line segment, whichever is between the most recent roll axis and substantially the projection onto the plane of the center of gravity of the body, the first line segment being defined by a first pair of the lead tips in the group of three of the lead tips and the second line segment being defined by a second pair of the lead tips in the group of three of the lead tips, the second pair being different from the first pair and neither the first pair nor the second pair defining any previous roll axis, the group of three of the lead tips being redefined after each repetition as the additional lead tip and the two of the lead tips in the group of three of the lead tips which are on the new roll axis.

54. The method according to claim 53, wherein the step of providing comprises the steps of:

setting up in the computer memory representations of a starting plane and the positions in space of the lead tips relative to each other and to the starting plane, the starting plane passing through a first one of the lead tips, all others of the lead tips being either on the starting plane or on the same side of the starting plane as the body;

modifying in the computer memory in a manner which corresponds to rotation, relative to the starting plane, of the body about a first roll axis the representation of at least one member of the group consisting of the plane and the positions of the lead tips, until the starting plane passes through a second lead tip, the second lead tip being the first to touch the starting plane during such rotation about the first roll axis, the first roll axis being the line in the starting plane which passes through the first lead tip and is perpendicular to a line passing through the first lead tip and a projection of the center of gravity of the body into the starting plane; and modifying in the computer memory in a manner which corresponds to rotation, relative to the starting plane, of the body about a second roll axis the representation of at least one member of the group consisting of the plane and the positions of the lead tips, until the starting plane passes through a third lead tip, the third lead tip being the first to touch the starting plane during such rotation about the second roll axis, the second roll axis being the line defined by the first and second lead tips, the group of three of the lead tips being initially defined as the first, second and third lead tips.

55. The method according to claim 53, wherein the step of modifying in the computer memory consists of the step of updating in the computer memory the representation of the plane in a manner which corresponds to rotation of the plane about the new roll axis until the plane passes through the additional lead tip.

56. A method according to claim 55, further comprising the step of determining whether any of the lead tips are more than a predetermined distance from the plane.

57. A method according to claim 56, further comprising, if the projection of the center of gravity onto the plane is on the triangle defined by the group of three of the lead tips, the steps of:

altering in the computer memory the representation of the plane in a manner which corresponds to rotation of the plane about a rocking axis until the plane passes through a fourth lead tip, the fourth lead tip being the lead tip on the side of the rocking axis opposite a given one of the lead tips in the group of three of the lead tips, which lead tip is the first to touch the plane during such rotation about the rocking axis, the rocking axis being the line passing through two of the lead tips in the group of three of the lead tips and also passing through the projection into the plane of the center of gravity of the body, the given one of the lead tips being the lead tip in the group of three of the lead tips which is not on the rocking axis; and determining whether any of the lead tips are more than a predetermined distance from the plane as represented after the step of altering.

58. A method for use with apparatus for determining the y-z position of an edge passing through a sensing plane parallel to a y-z plane in an x-y-z coordinate system, the apparatus including a means for calculating such y-z position, and further including an original part and a spare part to replace the original part, the method comprising the steps of:

obtaining a first set of calibration data for the apparatus with the original part installed;

obtaining a second set of calibration data for the apparatus with the spare part installed; and storing both the first and second sets of calibration data for subsequent use by the means for calculating, the means for calculating using the first set of calibration data when the original part is installed and using the second set of calibration data when the spare part is installed.

59. A method for use with apparatus for determining position information about a first edge of a workpiece, the apparatus comprising:

source means for emitting energy from a known source region, the known source region having a non-zero z-dimension;

first detection means for outputting a first signal nominally indicative of the amount of energy emitted from the source region which reaches a first known detection region;

second detection means for outputting a second signal nominally indicative of the amount of energy emitted from the source region which reaches a second known detection region; and means for calculating an apparent y-z position of the edge in response to the first and second signals, the method comprising the steps of:

positioning a calibration edge at a first known y-z position;

calculating for the current known y-z position of the calibration edge an expected value of the first signal;

calculating for the current known y-z position of the calibration edge an expected value of the second signal;

storing in relation to the nominal value of the first signal a first correction term which when applied to the nominal value of the first signal will yield substantially the expected value of the first signal;

storing in relation to the nominal value of the second signal a second correction term which when applied to the nominal value of the second signal will yield substantially the expected value of the second signal;

moving the calibration edge to a known y-z position at which the first detection means or the second detection means outputs a signal different from that output by the same detection means for any previous y-z position of the calibration edge; and repeating for a desired number of repetitions the steps of calculating, storing in relation to the nominal value of the first signal, storing in relation to the nominal value of the second signal and moving;

wherein the step of storing in relation to the nominal value of the first signal comprises the step of storing in correspondence: (a) the first correction term and (b) an index ratio $I_{read1}/(I_{open1} - I_{closed1})$, where $I_{read1}$ is the nominal value of the first signal for the current y-z position of the calibration edge, $I_{open1}$ is the nominal value of the first signal when the calibration edge blocks none of the energy emitted from the source region from reaching the first detection region, and $I_{closed1}$ is the nominal value of the first signal when the calibration edge blocks all of the energy emitted from the source region from reaching the first detection region directly, and wherein the step of storing in relation to the nominal value of the second signal comprises the step of storing in correspondence: (a) the second correction term and (b) an index ratio $I_{read2}/(I_{open2} - I_{closed\,2})$, where $I_{read2}$ is the nominal value of the second signal for the current y-z position of the calibration edge, $I_{open2}$ is the nominal value of the second signal when the calibration edge blocks none of the energy emitted from the source region from reaching the second detection region, and $I_{closed2}$ is the nominal value of the second signal when the calibration edge blocks all of the energy emitted from the source region from reaching the second detection region directly.

60. A method according to claim 59, further comprising the steps of:

storing $(I_{open1} - I_{closed1})$ and $(I_{open2} - I_{closed2})$;

reading an obtained nominal value of the first signal when the apparatus is in field use;

reading an obtained nominal value of the second signal when the apparatus is in field use;

determining a first pair of nominal values of the first signal for which correction terms were stored during the step of storing in relation to the nominal value of the first signal, which first pair correspond most closely with the obtained nominal value of the first signal;

determining a second pair of nominal values of the second signal for which correction terms were stored during the step of storing in relation to the nominal value of the second signal, which second pair correspond most closely with the obtained nominal value of the second signal;

applying to the obtained nominal value of the first signal a correction term which is interpolated between a first pair of correction terms stored in relation to the first pair of nominal values, which first pair of correction terms were stored during the step of storing in relation to the nominal value of the first signal; and applying to the obtained nominal value of the second signal a correction term which is interpolated between a second pair of correction terms stored in relation to the second pair of nominal values, which second pair of correction terms was stored during the step of storing in relation to the nominal value of the second signal; and wherein the step of determining a first pair of nominal values comprises the step of selecting the two stored index ratios $I_{read1}/(I_{open1} - I_{closed1})$ which are closest to the ratio between the obtained nominal value of the first signal and the stored value of $(I_{open1} - I_{closed1})$; and wherein the step of determining a second pair of nominal values comprises the step of selecting the two stored index ratios $I_{read2}/(I_{open2} - I_{closed2})$ which are closest to the ratio between the obtained nominal value of the first signal and the stored value of $(I_{open2} - I_{closed2})$.

61. Apparatus for inspecting a workpiece, the workpiece having a first side surface and a base surface, the workpiece having a plurality of edges including a first body edge at a meeting between the first side surface and the base surface, the plurality of edges further inlcuding a subject edge, the apparatus being associated with a coordinate system having an origin and mutually perpendicular x, y and z axes extending from the origin, the apparatus being further associated with a sensing plane parallel to the y-z plane, the apparatus comprising:

source means for emitting energy from a known source region, the known source region having a non-zero z-dimension and being no wider in the x-dimension than a desired width, the source region consisting of a set of source points;

means for staging the workpiece such that the subject edge passes through the sensing plane and blocks part of the energy emitted from the known source region to thereby create a shadow having a penumbra indicative of the position of the subject edge, the penumbra having an intensity-of-shadow which varies at least in the z-dimension;

means for outputting a first signal indicative of the amount of energy which reaches a first known detection region in the penumbra from the source means, the first known detection region consisting of a first set of detection points; and means for outputting a second signal indicative of the amount of energy which reaches a second known detection region in the penumbra from the source means, the second known detection region consisting of a second set of detection points; and means for determining the y coordinate of the point where the subject edge passes through the sensing plane, including means for calculating values of constants in a formula obtained by solving substantially the two simultaneous equations defined by (1) an integration of the estimated effect on the first signal which would be caused by the incidence on each detection point in the first set of detection points of energy from each source point in the set of source points which would reach such detection point in the first set of detection points if the subject edge is at an arbitrary y-z position, and by (2) an integration of the estimated effect on the second signal which would be caused by the incidence on each detection point in the second set of detection points of energy from each source point in the set of source points which would reach such detection point in the second set of detection points if the subject edge is at the arbitrary y-z position.

62. Apparatus according to claim 61, wherein the source region is essentially a line segment extending in the sensing plane from $(y,z)=(h,-a)$ to $(y,z)=(h,a)$;

wherein the first known detection region is essentially a line segment extending in the sensing plane from $(y,z)=(0,z_{b1})$ to $(y,z)=(0,z_{t1})$;

wherein the second known detection region is essentially a line segment extending in the sensing plane from $(y,z)=(0,z_{b2})$ to $(y,z)=(0,z_{t2})$; and wherein the two simultaneous equations are given by, respectively, $$v_1(y,z) = [y^2+(z_{t1}-z)^2]^{\frac{1}{2}} - [y^2+(z_{b1}-z)^2]^{\frac{1}{2}} \quad (1)$$

and $$v_2(y,z) = [y^2+(z_{t2}-z)^2]^{\frac{1}{2}} - [y^2+(z_{b2}-z)^2]^{\frac{1}{2}}; \quad (2)$$

where $$v_1(y,z) = \frac{-I_1(y,z)}{K_1} + [h^2+(z_{t1}+a)^2]^{\frac{1}{2}} - [h^2+(z_{b1}+a)^2]^{\frac{1}{2}},$$

$$v_2(y,z) = \frac{-I_2(y,z)}{K_2} + [h^2+(z_{t2}+a)^2]^{\frac{1}{2}} - [h^2+(z_{b2}+a)^2]^{\frac{1}{2}},$$

$K_1$ and $K_2$ are constants, $I_1(y,z)$ is the estimated value of the first signal when the subject edge is at an arbitrary y-z position, and $I_2(y,z)$ is the estimated value of the second signal when the subject edge is at the arbitrary y-z position.

63. A method for inspecting a workpiece having an edge, in apparatus associated with a coordinate system having mutually perpendicular x, y and z axes, said apparatus further having associated therewith a sensing plane parallel to the y-z plane, said method comprising the steps of:

staging said workpiece such that said edge intersects said sensing plane, said edge intersecting said sensing plane at an intersection point having y and z coordinates;

emitting energy such that said edge creates a shadow having a grey region, said grey region having an intensity-of-shadow which varies in the z-dimension substantially according to a known function of said y and z coordinates; and determining from the amount of energy which reaches a first known detection region in said grey region a first relationship between said y and z coordinates.

64. A method according to claim 63, wherein said step of determining a first relationship comprises the step of calculating from the amount of energy which reaches said first known detection region the value of a first constant in a first predetermined formula relating said y and z coordinates.

65. A method according to claim 63, further comprising the step of determining from the amount of energy which reaches a second known detection region in said grey region a second relationship between said y and z coordinates.

66. A method according to claim 65, wherein said step of determining a first relationship comprises the step of calculating from the amount of energy which reaches said second known detection region the value of a second constant in a second predetermined formula relating said y and z coordinates, further comprising the step of calculating said y coordinate from said first and second constants.

67. A method according to claim 65, wherein said step of determining a first relationship comprises the step of calculating from the amount of energy which reaches said second known detection region the value of a second constant in a second predetermined formula relating said y and z coordinates, further comprising the step of calculating said z coordinate from said first and second constants.

68. A method according to claim 67, further comprising the step of calculating said y coordinate from said z coordinate.

69. A method for inspecting a workpiece having an edge, in apparatus associated with a coordinate system having mutually perpendicular x, y and z axes, said apparatus further having associated therewith a sensing plane parallel to the y-z plane, said method comprising the steps of:

staging said workpiece such that said edge intersects said sensing plane, said edge intersecting said sensing plane at an intersection point having y and z coordinates;

emitting electromagnetic energy such that said edge creates a shadow having a penumbra, said penumbra having an intensity-of-shadow which varies in the z dimension substantially according to a known function of said y and z coordinates; and calculating said y and z coordinates from the amount of energy which reaches respective first and second known detection regions in said penumbra.

70. A method according to claim 69, further comprising the step of correcting according to a correcting algorithm the values obtained in said step of calculating said y and z coordinates.

71. A method according to claim 69, wherein said step of emitting electromagnetic energy comprises the step of emitting said electromagnetic energy from a source region being essentially a line segment extending in said sensing plane from $(y,z)=(h,-a)$ to $(y,z)=(h,a)$, wherein said first known detection region is essentially a line segment extending in said sensing plane from $(y,z)=(0,z_{b1})$ to $(y,z)=(0,z_{t1})$, and wherein said second known detection region is essentially a line segment extending in said sending plane from $(y,z)=(0,z_{b2})$ to $(y,z)=(0,z_{t2})$, further comprising the step of outputting a first signal indicative of the amount of energy which reaches said first known detection region and a second signal indicative of the amount of energy which reaches said second known detection region, and wherein said step of calculating comprises the step of computing a value for y from the simultaneous equations:

$$v_1(y,z)=[y^2+(z_{t1}-z)^2]^{\frac{1}{2}}-[y^2+(z_{b1}-z)^2]^{\frac{1}{2}} \quad (1)$$

and $$v_2(y,z)=[y^2+(z_{t2}-z)^2]^{\frac{1}{2}}-[y^2+(z_{b2}-z)^2]^{\frac{1}{2}}; \quad (2)$$

where $$v_1(y,z) = \frac{-I_1(y,z)}{K_1} + [h^2 + (z_{t1} + a)^2]^{\frac{1}{2}} - [h^2 + (z_{b1} + a)^2]^{\frac{1}{2}},$$

$$v_2(y,z) = \frac{-I_2(y,z)}{K_2} + [h^2 + (z_{t2} + a)^2]^{\frac{1}{2}} - [h^2 + (z_{b2} + a)^2]^{\frac{1}{2}},$$

$K_1$ and $K_2$ are constants, and
$I_1(y,z)$ and $I_2(y,z)$ are the values respectively of said first and second signals.

72. A method according to claim 69, further comprising the steps of:

moving said workpiece relative to said first and second known detection regions in a direction not substantially parallel to said sensing plane; and repeating said step of calculating.

73. A method according to claim 69, wherein said step of emitting electromagnetic energy comprises the step of emitting said electromagnetic energy from a source region being essentially a line segment extending in said sensing plane from $(y,z)=(h,-a)$ to $(y,z)=(h,a)$, wherein said first known detection region is essentially a line segment extending in said sensing plane from $((y,z)=(0,z_{b1})$ to $(y,z)=(0,z_{t1})$, and wherein said second known detection region is essentially a line segment extending in said sensing plane from $(y,z)=(0,z_{b2})$ to $(y,z)=(0,z_{t2})$, further comprising the step of outputting a first signal indicative of the amount of energy which reaches said first known detection region and a second signal indicative of the amount of energy which reaches said second known detection region, and wherein said step of calculating comprises the step of computing a value for z from the simultaneous equations:

$$v_1(y,z)=[y^2+(z_{t1}-z)^2]^{\frac{1}{2}}-[y^2+(z_{b1}-z)^2]^{\frac{1}{2}} \quad (1)$$

and $$v_2(y,z)=[y^2+(z_{t2}-z)^2]^{\frac{1}{2}}-[y^2+(z_{b2}-z)^2]^{\frac{1}{2}}; \quad (2)$$

where $$v_1(y,z) = \frac{-I_1(y,z)}{K_1} + [h^2 + (z_{t1} + a)^2]^{\frac{1}{2}} - [h^2 + (z_{b1} + a)^2]^{\frac{1}{2}},$$

$$v_2(y,z) = \frac{-I_2(y,z)}{K_2} + [h^2 + (z_{t2} + a)^2]^{\frac{1}{2}} - [h^2 + (z_{b2} + a)^2]^{\frac{1}{2}},$$

$K_1$ and $K_2$ are constants, and
$I_1(y,z)$ and $I_2(y,z)$ are the values respectively of said first and second signals.

74. A method according to claim 73, wherein the step of calculating further comprises the step of inserting for $I_1(y,z)$ the actual value of the first signal as modified by an empirically determined correction term.

75. A method according to claim 69, wherein said step of emitting electromagnetic energy comprises the step of emitting said electromagnetic energy from a source region being essentially a line segment extending in said sensing plane from $(y,z)=(h,-a)$ to $(y,z)=(h,a)$, wherein said first known detection region is essentially a line segment extending in said sensing plane from $(y,z)=(0,z_{b1})$ to $(y,z)=(0,z_{t1})$.

further comprising the step of outputting a first signal indicative of the amount of energy which reaches said first known detection region, and wherein said step of calculating includes the step of computing the value of a constant $v_1(y,z)$ substantially from the formula:

$$v_1(y,z) = \frac{-I_1(y,z)}{K_1} + [h^2 + (z_{t1} + a)^2]^{\frac{1}{2}} - [h^2 + (z_{b1} + a)^2]^{\frac{1}{2}},$$

$K_1$ being a constant and $I_1(y,z)$ being the value of said first signal.

76. A method according to claim 75, wherein said second known detection region is essentially a line segment extending in said sensing plane from $(y,z)=(0,z_{b2})$ to $(y,z)=(0,z_{t2})$, further comprising the step of outputting a second signal indicative of the amount of energy which reaches said second known detection region, and wherein said step of calculating further includes the steps of:

computing the value of a constant $v_2(y,z)$ substantially from the formula:

$$v_2(y,z) = \frac{-I_2(y,z)}{K_2} + [h^2 + (z_{t2} + a)^2]^{\frac{1}{2}} - [h^2 + (z_{b2} + a)^2]^{\frac{1}{2}},$$

where $K_2$ is a constant and $I_2(y,z)$ is the value of said second signal; and computing values for y and z from the simultaneous equations:

$$v_1(y,z)=[y^2+(z_{t1}-z)^2]^{\frac{1}{2}}-[y^2+(z_{b1}-z)^2]^{\frac{1}{2}} \quad (1)$$

and $$v_2(y,z)=[y^2+(z_{t2}-z)^2]^{\frac{1}{2}}-[y^2+(z_{b2}-z)^2]^{\frac{1}{2}} \quad (2).$$

77. A method according to claim 69, wherein said step of emitting electromagnetic energy comprises the step of emitting said electromagnetic energy from a known source region, further comprising the step of outputting a first signal indicative of the amount of energy which reaches said first known detection region and a second signal indicative of the amount of energy which reaches a second known detection region;

and wherein the step of calculating said y and z coordinates comprises the step of calculating said y and z coordinates from said first and second signals using a predetermined algorithm.

78. A method according to claim 77, wherein said source region consists of a set of source points and said first and second known detection regions consist of respective first and second sets of detection points, further comprising the steps of:

deriving a first formula relating said y coordinate to said z coordinate by solving an integration of the estimated effect on said first signal which would be caused by the incidence on each detection point in said first set of detection points of energy from each source point in said set of source points which is not blocked by said edge; and predetermining said algorithm using said first formula.

79. A method according to claim 78, further comprising the step of deriving a second formula relating said y coordinate to said z coordinate by solving an integration of the estimated effect on said second signal which would be caused by the incidence on each detection point in said second set of detection points of energy from each source point in said set of source points which is not blocked by said edge, and wherein said step of predetermining comprises the step of solving said first and second formulas as simultaneous equations in x and y.

* * * * *